United States Patent
Futatsuyama et al.

(10) Patent No.: US 12,414,310 B2
(45) Date of Patent: Sep. 9, 2025

(54) SEMICONDUCTOR MEMORY DEVICES AND METHOD OF MANUFACTURING THE SAME

(71) Applicant: SAMSUNG ELECTRONICS CO., LTD., Suwon-si (KR)

(72) Inventors: Takuya Futatsuyama, Suwon-si (KR); Daeseok Byeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 166 days.

(21) Appl. No.: 18/375,173

(22) Filed: Sep. 29, 2023

(65) Prior Publication Data
US 2024/0306402 A1    Sep. 12, 2024

(30) Foreign Application Priority Data
Mar. 10, 2023    (KR) .................. 10-2023-0031878

(51) Int. Cl.
*G11C 5/06* (2006.01)
*G11C 16/04* (2006.01)
(Continued)

(52) U.S. Cl.
CPC ......... *H10B 80/00* (2023.02); *G11C 16/0483* (2013.01); *G11C 16/16* (2013.01);
(Continued)

(58) Field of Classification Search
CPC ....... G11C 5/063; G11C 7/18; G11C 11/4097; G11C 5/025; G11C 5/04
(Continued)

(56) References Cited

U.S. PATENT DOCUMENTS 10,734,080 B2 *   8/2020   Chibvongodze ...   G11C 16/0483
10,734,371 B2     8/2020   Park
(Continued)

FOREIGN PATENT DOCUMENTS

WO    2022/098395 A1    5/2022

OTHER PUBLICATIONS

Communication dated Oct. 8, 2024, issued by the European Patent Office in counterpart European Application No. 24152566.6.
(Continued)

*Primary Examiner* — Son T Dinh
(74) *Attorney, Agent, or Firm* — Sughrue Mion, PLLC

(57) ABSTRACT

In some embodiments, a semiconductor memory device includes a peripheral circuit structure, and a first and a second cell array structure. The peripheral circuit structure includes a circuit board, a peripheral circuit on the circuit board, a first insulating layer, and a plurality of first bonding pads on the first insulating layer. The first cell array structure includes a first memory cell array, a first conductive plate structure, a second insulating layer, and pluralities of second and third bonding pads on the second insulating layer. The second cell array structure includes a second memory cell array, a second conductive plate structure, a third insulating layer, and a plurality of fourth bonding pads on the third insulating layer. The first cell array structure and the second cell array structure are sequentially stacked in a vertical direction on the peripheral circuit structure.

20 Claims, 25 Drawing Sheets

(51) Int. Cl.
    *G11C 16/16* (2006.01)
    *G11C 16/34* (2006.01)
    *H01L 23/00* (2006.01)
    *H01L 25/00* (2006.01)
    *H01L 25/065* (2023.01)
    *H01L 25/18* (2023.01)
    *H10B 80/00* (2023.01)

(52) U.S. Cl.
    CPC .......... *G11C 16/3445* (2013.01); *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80006* (2013.01); *H01L 2224/80895* (2013.01); *H01L 2224/80896* (2013.01); *H01L 2924/1431* (2013.01); *H01L 2924/14511* (2013.01)

(58) Field of Classification Search
    USPC ...................................................... 365/63, 51
    See application file for complete search history.

(56) References Cited

U.S. PATENT DOCUMENTS

| | | |
|---|---|---|
| 10,748,923 B2 | 8/2020 | Son et al. |
| 10,879,260 B2 | 12/2020 | Uryu et al. |
| 10,957,680 B2 | 3/2021 | Yada et al. |
| 11,024,385 B2 | 6/2021 | Chibvongodze et al. |
| 11,239,209 B2 | 2/2022 | Oh et al. |
| 11,450,653 B2 | 9/2022 | Huang et al. |
| 11,587,920 B2 | 2/2023 | Alsmeier et al. |
| 2022/0157754 A1 | 5/2022 | Park et al. |

OTHER PUBLICATIONS

Luca Crippa et al., "3D Charge Trap NAND Flash Memories," 3D Flash Memories, Chapter 4, pp. 85-127, Jan. 2016, XP093181774.
Communication issued Jul. 16, 2024 by the European Patent Office in the European Patent Application No. 24152566.6.
Micheloni, Rino et al., "3D Stacked NAND Flash Memories", 3D Flash Memories, Jan. 1, 2016, pp. 63-83, XP093181705, URL:http://link.springer.com/content/pdf/10.1007/978-94-017-7512-0_3>.

\* cited by examiner

SEMICONDUCTOR MEMORY DEVICES AND METHOD OF MANUFACTURING THE SAME

CROSS-REFERENCE TO RELATED APPLICATIONS

This application claims benefit of priority under 35 U.S.C. § 119 to Korean Patent Application No. 10-2023-0031878, filed on Mar. 10, 2023, in the Korean Intellectual Property Office, the disclosure of which is incorporated by reference herein in its entirety.

BACKGROUND

1. Field

The present disclosure relates generally to semiconductor memory devices, and more particularly, to semiconductor memory devices with stepped structures and a method of manufacturing the same.

2. Description of Related Art

According to high demand for performance and/or economic efficiency, a degree of integration of related integrated circuit devices may need to increase. That is, the degree of integration of integrated circuit devices, such as, but not limited to, memory devices, may be an important factor in determining the economic feasibility of products utilizing the integrated circuit devices. For example, the degree of integration of two-dimensional memory devices may be primarily determined by an area occupied by unit memory cells, and thus, may be significantly affected by the level of fine pattern formation technology applied to the two-dimensional memory device. However, a cost of equipment that may be needed to form the fine patterns and the area of chip dies may be prohibitive, which may negatively impact the economic feasibility of the integrated circuit device formed using the fine pattern formation technology. Alternatively or additionally, an area of a chip die of such an integrated circuit may be limited. Consequently, although the degree of integration of two-dimensional memory devices may have increased, the degree of integration of two-dimensional memory devices may still be limited. Accordingly, there exists a need for further improvements in the integration of integrated circuit devices, as the need for increases in performance and economic feasibility continue to intensify. For example, vertical memory devices having a three-dimensional structure may be desired.

SUMMARY

Aspects of the present disclosure provide for semiconductor memory devices with high performance, high integration, and improved stability, when compared to related semiconductor memory devices.

According to an aspect of the present disclosure, a semiconductor memory device is provided. The semiconductor memory device includes a peripheral circuit structure, a first cell array structure, and a second cell array structure. The peripheral circuit structure includes a circuit board, a peripheral circuit on the circuit board, a first insulating layer partially covering the peripheral circuit, and a plurality of first bonding pads on the first insulating layer. The first cell array structure includes a first memory cell array, a first conductive plate structure on the first memory cell array, a second insulating layer partially covering the first memory cell array, a plurality of second bonding pads on the second insulating layer, and a plurality of third bonding pads on the second insulating layer. The second cell array structure is stacked on the first cell array structure, and includes a second memory cell array, a second conductive plate structure on the second memory cell array, a third insulating layer partially covering the second memory cell array, and a plurality of fourth bonding pads on the third insulating layer. The first cell array structure and the second cell array structure are sequentially stacked in a vertical direction on the peripheral circuit structure. The plurality of first bonding pads respectively contact the plurality of second bonding pads. The plurality of third bonding pads respectively contact the plurality of fourth bonding pads. The first memory cell array includes a plurality of first wordlines, and a first stepped structure in which a first planar area of the first stepped structure gradually decreases as a first distance from the first conductive plate structure increases. The second memory cell array includes a plurality of second wordlines, and a second stepped structure in which a second planar area of the second stepped structure gradually decreases as a second distance from the second conductive plate structure increases. The first cell array structure further includes a first wordline contact coupled to a first wordline of the plurality of first wordlines of the first memory cell array. The second cell array structure further includes a second wordline contact coupled to a second wordline of the plurality of second wordlines of the second memory cell array. The first wordline contact is electrically coupled to the second wordline contact.

According to an aspect of the present disclosure, a semiconductor memory device is provided. The semiconductor memory device includes a peripheral circuit structure, a first cell array structure, and a second cell array structure. The peripheral circuit structure includes a circuit board, a peripheral circuit on the circuit board, a first insulating layer partially covering the peripheral circuit, and a plurality of first bonding pads on the first insulating layer. The first cell array structure includes a first memory cell array, a first conductive plate structure on the first memory cell array, a second insulating layer partially covering the first memory cell array, a plurality of second bonding pads on the second insulating layer, and a plurality of third bonding pads on the second insulating layer. The second cell array structure is stacked on the first cell array structure, and includes a second memory cell array, a second conductive plate structure on the second memory cell array, a third insulating layer partially covering the second memory cell array, and a plurality of fourth bonding pads on the third insulating layer. The first cell array structure and the second cell array structure are sequentially stacked in a vertical direction on the peripheral circuit structure. The plurality of first bonding pads respectively contact the plurality of second bonding pads. The plurality of third bonding pads respectively contact the plurality of fourth bonding pads. The first memory cell array includes a first stepped structure in which a first planar area of the first stepped structure gradually decreases as a first distance from the first conductive plate structure increases. The second memory cell array includes a second stepped structure in which a second planar area of the second stepped structure gradually decreases as a second distance from the second conductive plate structure increases. The first conductive plate structure includes a first cell plate on a first cell region of the first memory cell array coupled to a first common source line. The second conductive plate structure includes a second cell plate on a second cell region of the second memory cell array coupled to a second common source line. The first cell plate includes a first tapered shape in which a first width of the first cell plate decreases as a third distance from the first memory cell array increases. The second cell plate includes a second tapered shape in which a second width of the second cell plate decreases as a fourth distance from the second memory cell array increases.

According to an aspect of the present disclosure, a semiconductor memory device is provided. The semiconductor memory device includes a peripheral circuit structure, a first cell array structure, and a second cell array structure. The peripheral circuit structure includes a circuit board, a peripheral circuit on the circuit board, a first insulating layer partially covering the peripheral circuit, and a plurality of bonding pads on the first insulating layer. The first cell array structure includes a first memory cell array, a first conductive plate structure on the first memory cell array, a second insulating layer partially covering the first memory cell array, a plurality of second bonding pads on the second insulating layer, and a plurality of third bonding pads on the second insulating layer. The second cell array structure is stacked on the first cell array structure, and includes a second memory cell array, a second conductive plate structure on the second memory cell array, a third insulating layer partially covering the second memory cell array, and a plurality of fourth bonding pads on the third insulating layer. The first cell array structure and the second cell array structure are sequentially stacked in a vertical direction on the peripheral circuit structure. The plurality of first bonding pads respectively contact the plurality of second bonding pads. The plurality of third bonding pads respectively contact the plurality of fourth bonding pads. The first memory cell array includes a plurality of first cell strings, a plurality of first wordlines, a plurality of first ground select lines, and a first stepped structure in which a first planar area of the first memory cell array gradually decreases as a first distance from the first conductive plate structure increases. The second memory cell array includes a plurality of second cell strings, a plurality of second wordlines, a plurality of second ground select lines, and a second stepped structure in which a second planar area of the second memory cell array gradually decreases as a second distance from the second conductive plate structure increases. A first wordline of the plurality of first wordlines is coupled to a second wordline of the plurality of second wordlines. The plurality of first cell strings are coupled to a third wordline of the plurality of first wordlines. The plurality of second cell strings are coupled to a fourth wordline of the plurality of second wordlines. A first number of the plurality of first ground select lines coupled to the plurality of first cell strings is different from a second number of the plurality of second ground select lines coupled to the plurality of second cell strings.

Additional aspects may be set forth in part in the description which follows and, in part, may be apparent from the description, and/or may be learned by practice of the presented embodiments

BRIEF DESCRIPTION OF DRAWINGS

The above and other aspects, features, and advantages of certain embodiments of the present disclosure may be more apparent from the following description taken in conjunction with the accompanying drawings, in which.

DETAILED DESCRIPTION

Figure 1:
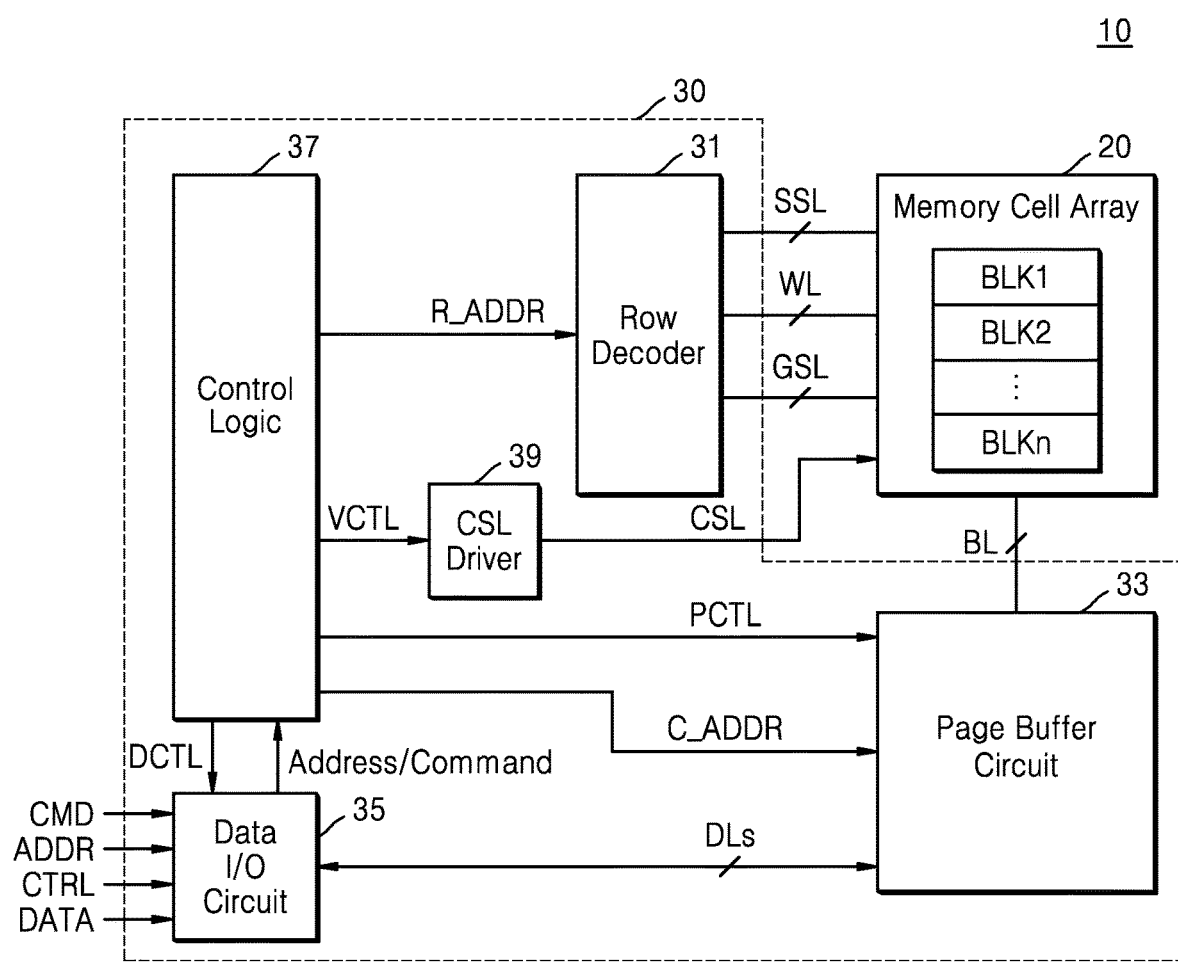
FIG. 1 is a block diagram of a semiconductor memory device, according to some embodiments.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or through a third element.

It is to be understood that when an element or layer is referred to as being "over," "above," "on," "below," "under," "beneath," "connected to" or "coupled to" another element or layer, it may be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", and the like may be replaced with terms, such as "first," "second," third" to be used to describe relative positions of elements. The terms "first," "second," third" may be used to describe various elements but the elements are not limited by the terms and a "first element" may be referred to as a "second element". Alternatively or additionally, the terms "first", "second", "third", and the like may be used to distinguish components from each other and do not limit the present disclosure. For example, the terms "first", "second", "third", and the like may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

The embodiments herein may be described and illustrated in terms of blocks, as shown in the drawings, which carry out a described function or functions. These blocks, which may be referred to herein as units or modules or the like, or by names such as device, logic, circuit, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein).

As used herein, each of the terms "BN", "CdS", "GaAs", "GaP", "Ge", "InAs, "InGaAs", "InP", "InSb", "Si", "SiGe", "SiN", "SiO", "TaN", "TiN", "ZnTe", and the like may refer to a material made of elements included in each of the terms and is not a chemical formula representing a stoichiometric relationship.

Hereinafter, various embodiments of the present disclosure are described with reference to the accompanying drawings.

FIG. 1 is a block diagram of a semiconductor memory device 10, according to an embodiment.

Referring to FIG. 1, the semiconductor memory device 10 may include a memory cell array 20 and a peripheral circuit 30.

The memory cell array 20 may include a plurality of memory cell blocks (e.g., first memory cell block BLK1, second memory cell block BLK2, to n-th memory cell block BLKn, where n is a positive integer greater than zero (0), hereinafter generally referred to as "BLK"). Each memory cell block of the plurality of memory cell blocks BLK may include a plurality of memory cells. The plurality of memory cell blocks BLK may be connected to the peripheral circuit 30 through a plurality of bitlines BL, a plurality of wordlines WL, a plurality of string select lines SSL, a plurality of ground select lines GSL, and a common source line CSL.

The memory cell array 20 may be connected (e.g., electrically coupled) to a page buffer 33 through the plurality of bitlines BL. Alternatively or additionally, the memory cell array 20 may be connected to a row decoder 31 through the plurality of wordlines WL, the plurality of string select lines SSL, and the plurality of ground select lines GSL. In the memory cell array 20, each of the plurality of memory cells included in the plurality of memory cell blocks BLK may be and/or may include a flash memory cell, for example. The memory cell array 20 may be and/or may include a three-dimensional (3D) memory cell array. The 3D memory cell array may be and/or may include a plurality of NAND strings. Alternatively or additionally, each of the plurality of NAND strings may be and/or may include a plurality of memory cells connected to a plurality of vertically stacked wordlines WL.

The peripheral circuit 30 may include the row decoder 31, the page buffer 33, a data input/output (I/O) circuit 35, a control logic 37, and a common source line driver 39. In an embodiment, the peripheral circuit 30 may further include various circuits, such as, but not limited to, a voltage generation circuit generating various voltages that may be needed for the operation of the semiconductor memory device 10, an error correction circuit for correcting errors in data read from the memory cell array 20, an I/O interface, and the like.

In an embodiment, the peripheral circuit 30 may receive an address ADDR, a command CMD, and/or a control signal CTRL from the outside of the semiconductor memory device 10 (e.g., an external device, a memory controller, a processor, and the like). Alternatively or additionally, the peripheral circuit 30 may transmit and/or receive data DATA to and/or from a device outside the semiconductor memory device 10.

An example configuration of the peripheral circuit 30 is described below.

In response to a row address R_ADDR provided from the control logic 37, the row decoder 31 may select at least one memory cell block of the plurality of memory cell blocks BLK. For example, the row decoder 31 may select a wordline WL, a string select line SSL, and/or a ground select line GSL of the selected memory cell block BLK. In an embodiment, the row decoder 31 may transmit a voltage for performing a memory operation to the wordline WL of the selected memory cell block BLK.

In an embodiment, the page buffer 33 may be connected (e.g., electrically coupled) to the memory cell array 20 through the plurality of bitlines BL. Alternatively or additionally, the page buffer 33 may operate as a write driver during a program (e.g., write) operation of the semiconductor memory device 10. For example, the page buffer 33 may apply a voltage according to the data DATA to be stored in the memory cell array 20 to the plurality of bitlines BL. As another example, the page buffer 33 may operate as a sense amplifier during a read operation of the semiconductor memory device 10. For example, the page buffer 33 may sense the data DATA stored in the memory cell array 20. In an optional or additional embodiment, the page buffer 33 may operate according to a control signal PCTL and a column address C_ADDR provided from the control logic 37.

Figure 13:
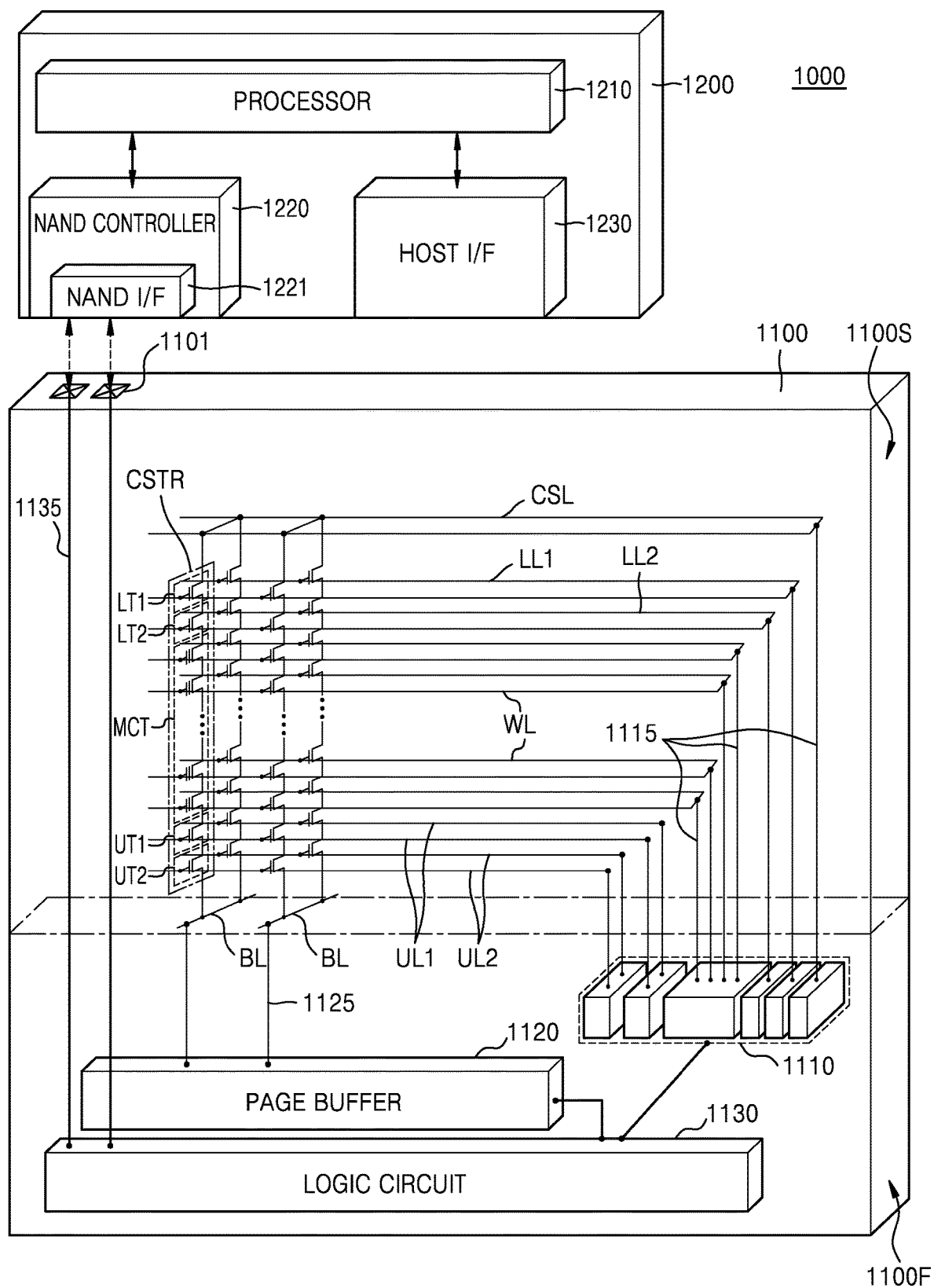
FIG. 13 is a diagram of an electronic system including a semiconductor memory device, according to some embodiments.

The data I/O circuit 35 may receive the address ADDR, the command CMD, and the control signal CTRL from a controller (e.g., controller 1200 of FIG. 13). The data I/O circuit 35 may be connected to the page buffer 33 through the plurality of data lines DLs. The data I/O circuit 35 may transfer an input address and/or command to the control logic 37. During the program (e.g., write) operation of the semiconductor memory device 10, the data I/O circuit 35 may receive the data DATA from the controller (e.g., controller 1200 of FIG. 13), and may provide the program data DATA to the page buffer 33 based on a control signal DCTL provided from the control logic 37. During the read operation of the semiconductor memory device 10, the data I/O circuit 35 may provide the read data DATA stored in the page buffer 33 to the controller (e.g., controller 1200 of FIG. 13) through the plurality of data lines DLs based on the control signal DCTL provided from the control logic 37.

The control logic 37 may provide the row address R_ADDR to the row decoder 31. Alternatively or additionally, the control logic 37 may provide the column address C_ADDR to the page buffer 33. That is, the control logic 37 may generate various internal control signals used by the semiconductor memory device 10 in response to an address and/or a command provided from the data I/O circuit 35. For example, the control logic 37 may adjust the voltage level provided to the plurality of wordlines WL and the plurality of bitlines BL when a memory operation such as a program (e.g., write) operation and/or an erase operation is performed.

The common source line driver 39 may be connected to the memory cell array 20 through the common source line CSL. The common source line driver 39 may apply a common source voltage (e.g., power voltage) and/or a ground voltage to the common source line CSL based on a control signal VCTL of the control logic 37.

The number and arrangement of components shown in FIG. 1 are provided as an example. In practice, there may be additional components, fewer components, different components, or differently arranged components than those shown in FIG. 1. Furthermore, two or more components shown in FIG. 1 may be implemented within a single component, or a single component shown in FIG. 1 may be implemented as multiple, distributed components.

Figure 2:
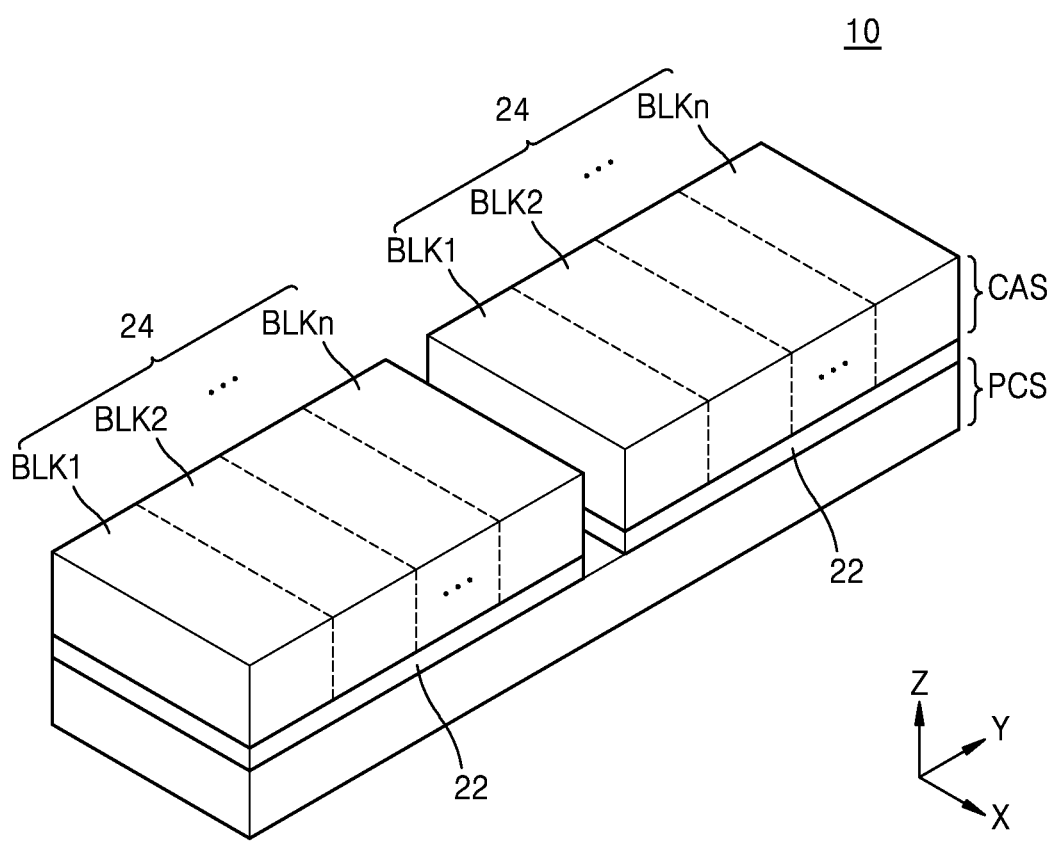
FIG. 2 is a schematic perspective view of a semiconductor memory device, according to some embodiments.

FIG. 2 is a schematic perspective view of a semiconductor memory device, according to an embodiment.

Referring to FIG. 2, the semiconductor memory device 10 may include a peripheral circuit structure PCS and a cell array structure CAS overlapping each other in a vertical direction (e.g., Z direction).

The cell array structure CAS may be and/or may include a memory cell array (e.g., memory cell array 20 of FIG. 1). Alternatively or additionally, the peripheral circuit structure PCS may be and/or may include the peripheral circuit (e.g., peripheral circuit 30 of FIG. 1).

A connection structure 22 may be arranged between the cell array structure CAS and the peripheral circuit structure PCS. The connection structure 22 may enable the cell array structure CAS and the peripheral circuit structure PCS to be stacked in the vertical direction (e.g., Z direction). The connection structure 22 may provide a physical and/or electrical connection between the cell array structure CAS and the peripheral circuit structure PCS. The connection structure 22 may enable electrical connection and/or data transmission between the cell array structure CAS and the peripheral circuit structure PCS.

The connection structure 22 may include a plurality of connectors for electrically connecting the cell array structure CAS and the peripheral circuit structure PCS. The plurality of connectors may include, but not be limited to, a metal-metal bonding structure, a through silicon via (TSV), a back via stack (BVS), a eutectic bonding structure, a ball grid array bonding (BGA) structure, a plurality of wiring lines, a plurality of contact plugs, and/or a combination thereof. For example, the metal-metal bonding structure may include, but not limited to, copper (Cu), aluminum (Al), tungsten (W), or a combination thereof.

The cell array structure CAS may include a plurality of tiles 24. Each of the plurality of tiles 24 may include the plurality of memory cell blocks BLK. Each of the plurality of memory cell blocks BLK may include three-dimensionally arranged memory cells.

Figure 3:
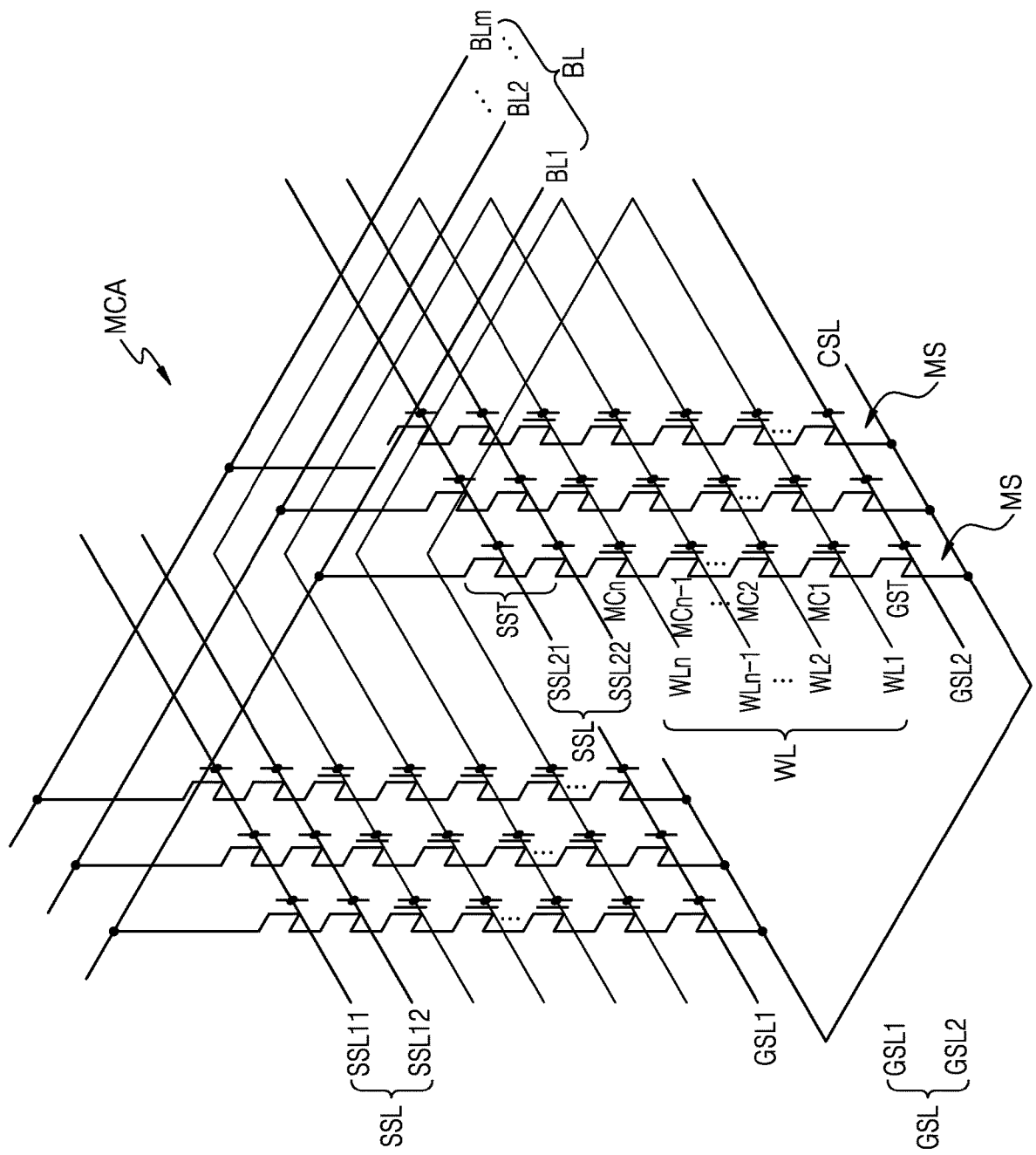
FIG. 3 is an equivalent circuit diagram of a memory cell array of a semiconductor memory device, according to some embodiments.

FIG. 3 is an equivalent circuit diagram of a memory cell array of a semiconductor memory device, according to an embodiment.

Referring to FIG. 3, an equivalent circuit diagram of a vertical NAND flash memory device having a vertical channel structure is illustrated.

In the semiconductor memory device 10, a memory cell array MCA may include a plurality of memory cell strings MS. The memory cell array MCA may include a plurality of bitlines BL (e.g., first bitline BL1, second bitline BL2, . . . , mth bitline BLm, hereinafter generally referred to "BL", where m is a positive integer greater than zero (0)), a plurality of wordlines WL (e.g., first wordline WL1, second wordline WL2, . . . , (n−1)th wordline WLn−1, and nth wordline WLn, hereinafter generally referred to as "WL"), at least one string select line SSL (e.g., first string select line SSL11, second string select line SSL12, third string select line SSL21, and fourth string select line SSL22), at least one ground select line GSL (e.g., ground select line GSL1, and second ground select line GSL2), and a common source line CSL.

The plurality of memory cell strings MS may be formed between the plurality of bitlines BL and the common source line CSL. As shown in FIG. 3, each of the plurality of memory cell strings MS may include two string select lines SSL. However, the present disclosure is not limited thereto. For example, each of the plurality of memory cell strings MS may include one string select line SSL.

Each of the plurality of memory cell strings MS may include a string select transistor SST, a ground select transistor GST, and a plurality of memory cell transistors (e.g., first memory cell transistor MC1, second memory cell transistor MC2, to (n−1)th memory cell transistor MCn−1, and n-th memory cell transistor MCn, hereinafter generally referred to as "MC"). In an embodiment, a drain region of the string select transistor SST may be connected to the bitline BL. Alternatively or additionally, a source region of the ground select transistor GST may be connected to the common source line CSL. The common source line CSL may refer to a region where source regions of the plurality of ground select transistors GST are connected in common.

The string select transistor SST may be connected to the string select line SSL. Alternatively or additionally, the ground select transistor GST may be connected to the ground select line GSL. The plurality of memory cell transistors MC may be respectively connected to the plurality of wordlines WL.

Each of the plurality of memory cell blocks BLK described above with reference to FIGS. 1 and 2 may include the memory cell array MCA having a circuit configuration as described with reference FIG. 3.

Figure 4:
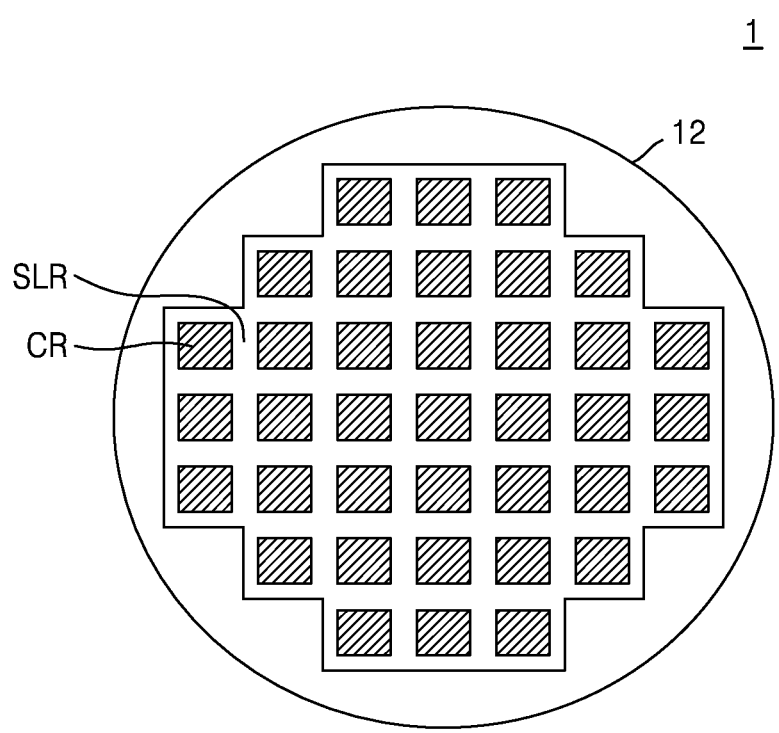
FIG. 4 is a schematic plan view of a semiconductor memory device, according to some embodiments.

FIG. 4 is a schematic plan view of a semiconductor memory device, according to some embodiments.

Referring to FIG. 4, the semiconductor memory device 1 may include a substrate 12 having a plurality of chip regions CR and a scribe lane region SLR surrounding each of the plurality of chip regions CR. The plurality of chip regions CR may be arranged in a matrix form on the substrate 12. The scribe lane region SLR may include cut regions for individualizing the plurality of chip regions CR.

Each of the plurality of chip regions CR may be and/or may include a high-density region having a relatively high pattern density. Alternatively or additionally, the scribe lane region SLR may be and/or may include a low-density region having a relatively low pattern density. The plurality of chip regions CR may include a cell array region of a semiconductor memory device, a peripheral circuit region including circuits configured to be electrically connected to cell arrays included in the cell array region, and a core region. In some embodiments, each of the plurality of chip regions CR may be and/or may include at least one non-volatile memory device. In some embodiments, the at least one non-volatile memory device may be and/or may include, but not be limited to, a NAND flash memory, a vertical NAND (VNAND) flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), a combination thereof, and the like. In an optional or additional embodiment, the at least one non-volatile memory device may be implemented as a three-dimensional (3D) array structure. For example, each of the plurality of chip regions CR may include the memory cell array 20 and the peripheral circuit 30 which are included in the semiconductor device 10 described with reference to FIG. 1. In some embodiments, the at least one non-volatile memory device may further include a volatile memory device such as dynamic random access memory (DRAM).

Figure 5:
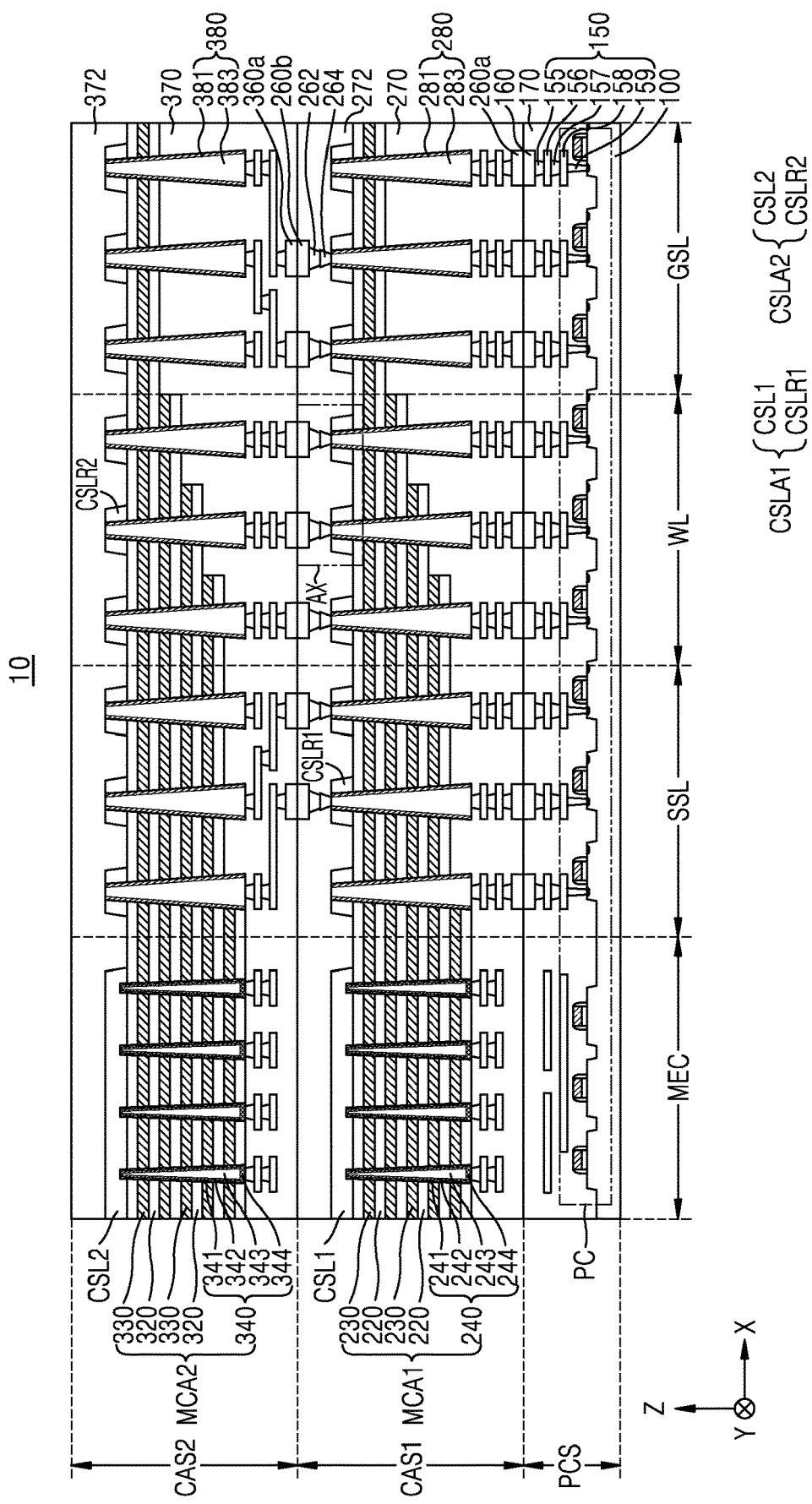
FIGS. 5 and 6 are plan views of a semiconductor memory device, according to some embodiments.
Figure 6:
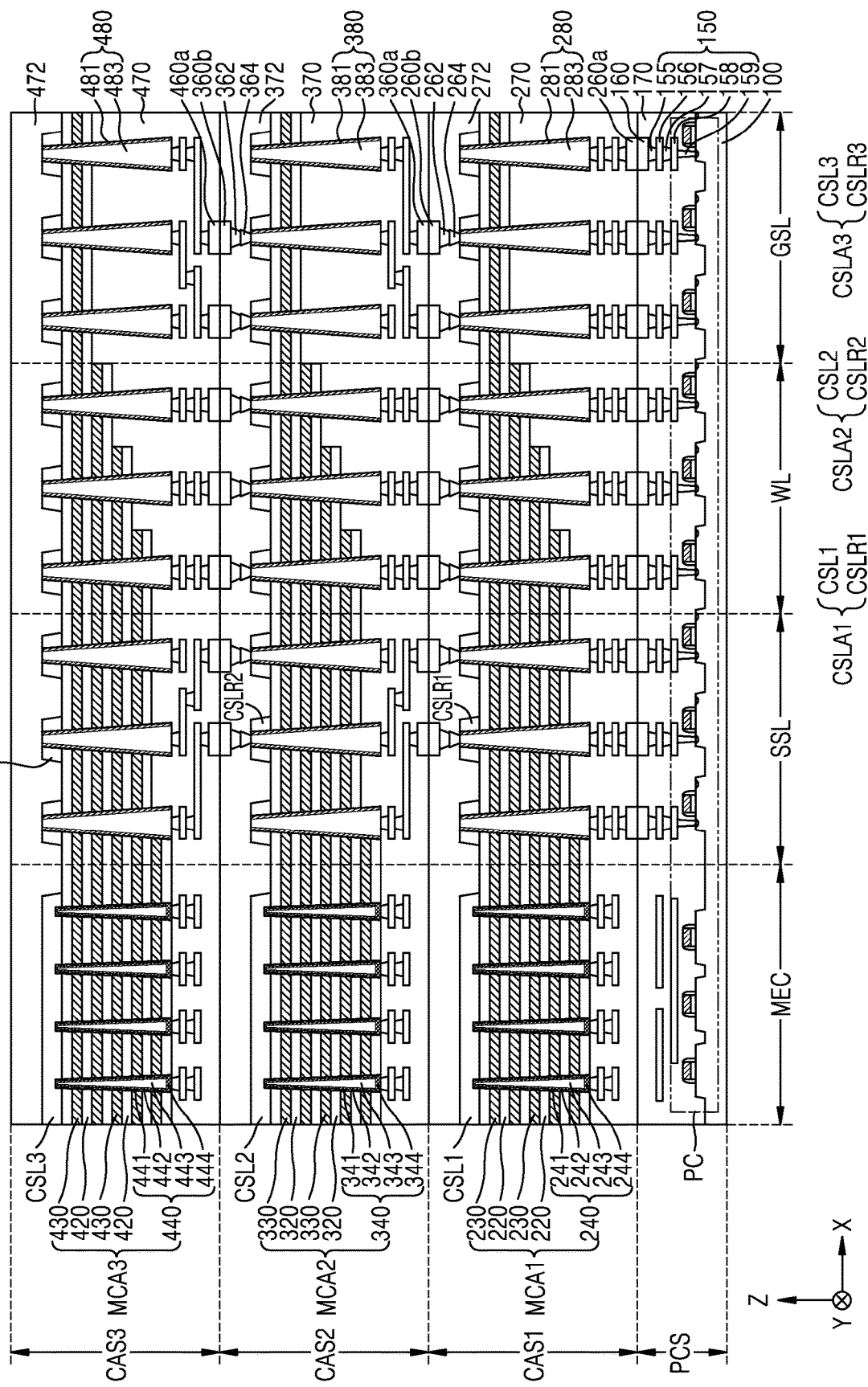

FIGS. 5 and 6 are plan views of a semiconductor memory device, according to some embodiments.

Referring to FIG. 5, a semiconductor memory device 10 may include a peripheral circuit structure PCS, and a plurality of cell array structures (e.g., first cell array structure CAS1 and second cell array structure CAS2, hereinafter generally referred to as "CAS") on the peripheral circuit structure PCS. The cell array structure CAS of FIG. 2 may include the plurality of cell array structures CAS of FIG. 5.

In an embodiment, the peripheral circuit structure PCS may be coupled to the plurality of cell array structures CAS. For example, first bonding pads 160 of the peripheral circuit structure PCS may be coupled to second bonding pads 260a of the first cell array structure CAS1. Alternatively or additionally, a first insulating layer 170 of the peripheral circuit structure PCS may be coupled to a second insulating layer 270 of the first cell array structure CAS1. In an optional or additional embodiment, third bonding pads 260b of the first cell array structure CAS1 may be coupled to fourth bonding pads 360a of the second cell array structure CAS2. In addition, the second insulating layer 270 of the first cell array structure CAS1 may be coupled to a third insulating layer 370 of the second cell array structure CAS2.

In some embodiments, the peripheral circuit structure PCS may further include at least one first dummy bonding pad in the first insulating layer 170. Alternatively or additionally, the first cell array structure CAS1 may further include at least one second dummy bonding pad in the second insulating layer 270. The first dummy bonding pad may contact the second dummy bonding pad. In an embodiment, the first dummy bonding pad and the second dummy bonding pad may contribute to physical coupling between the peripheral circuit structure PCS and the first cell array structure CAS1. Alternatively or additionally, the first dummy bonding pad and the second dummy bonding pad may not contribute to electrical connection therebetween.

The peripheral circuit structure PCS may include a circuit board 100, a peripheral circuit PC on an upper surface of the circuit board 100, the first insulating layer 170 covering the circuit board 100 and the peripheral circuit PC, and the first bonding pads 160 disposed on the first insulating layer 170. Alternatively or additionally, the peripheral circuit structure PCS may include a first wiring structure 150.

The first cell array structure CAS1 may include the first memory cell array MCA1, a first conductive plate structure CSLA1 on the first memory cell array MCA1, the second insulating layer 270 at least partially covering the first memory cell array MCA1, and second bonding pads 260a and third bonding pads 260b disposed on the second insulating layer 270. The first memory cell array MCA1 may be and/or may include the memory cell array MCA described with reference to FIG. 3.

An example configuration of the peripheral circuit structure PCS is described with reference to FIG. 5.

The circuit board 100 may be and/or may include a bulk wafer and/or a wafer having epitaxial growth. The circuit board 100 may include, but not be limited to, a group IV semiconductor material, a group III-V semiconductor material, and/or a group II-VI semiconductor material. The group IV semiconductor material may include, for example, silicon (Si), germanium (Ge), or silicon germanium (SiGe). The III-V group semiconductor material may include, but not be limited to, gallium arsenide (GaAs), indium phosphide (InP), gallium phosphide (GaP), indium arsenide (InAs), indium antimony (InSb), or indium gallium arsenide (InGaAs). The II-VI group semiconductor material may include, for example, zinc telluride (ZnTe) or cadmium sulfide (CdS).

The peripheral circuit PC may be and/or may include a plurality of transistors on the circuit board 100. The plurality of transistors may include a first transistor, a second transistor, and a third transistor. In an embodiment, a shallow trench isolation layer may be positioned between any two of the plurality of transistors.

The first transistor may be a component of the data I/O circuit 35 as described with reference to FIG. 1. The second transistor may be a component of the row decoder 31, the page buffer 33, and/or the control logic 37, as described with reference to FIG. 1. The third transistor may be a component of the common source line driver 39 as described with reference to FIG. 1.

The first wiring structure 150 may connect the peripheral circuit PC to the first bonding pad 160. The first wiring structure 150 may include a first wiring via 159, a first conductive line 158, a second wiring via 157, a second conductive line 156, and a third wiring via 155. Although FIG. 5 shows that the first wiring structure 150 includes three layers of wiring vias 159, 157, and 155, and two layers of conductive lines 158 and 156, the present disclosure is not limited thereto. For example, the first wiring structure 150 includes may include more or less layers of wiring vias and/or more or less layers of conductive lines.

The first insulating layer 170 may be arranged to cover at least a portion of the circuit board 100 and the peripheral circuit PC. The first insulating layer 170 may include, for example, silicon oxide (SiO), silicon nitride (SiN), a relatively low-k material, and/or a combination thereof. The relatively low-k material may be a material having a lower dielectric constant (k) than silicon oxide (SiO), such as, but not limited to, phosphosilicate glass (PSG), borophosphosilicate glass (BPSG), fluorosilicate glass (FSG), organosilicate glass (OSG), spin-on-glass (SOG), or a combination thereof.

An example of a configuration of the first cell array structure CAS1 is described below with reference to FIG. 5.

The first conductive plate structure CSLA1 may be and/or may include a semiconductor material, a metal material, and/or a combination thereof. In some embodiments, the first conductive plate structure CSLA1 may have a structure in which a polysilicon layer, a barrier metal layer, and a metal layer may be sequentially stacked. In some optional or additional embodiments, the first conductive plate structure CSLA1 may have a structure in which a polysilicon layer and a metal layer are stacked, or a polysilicon layer structure. The first conductive plate structure CSLA1 may function as the common source line CSL (e.g., CSL of FIG. 3).

In an embodiment, the first memory cell array MCA1 may include a plurality of first interlayer insulating layers 220 and a plurality of first gate layers 230 that may be alternately stacked under the first conductive plate structure CSLA1. Alternatively or additionally, the first memory cell array MCA1 may include a plurality of first channel structures 240 penetrating the plurality of first interlayer insulating layers 220 and the plurality of first gate layers 230. The plurality of first gate layers 230 may be formed in a stepped structure in which a planar area thereof gradually decreases as the distance from the first conductive plate structure CSLA1 increases. In an optional or additional embodiment, a second memory cell array MCA2 may include a plurality of second interlayer insulating layers 320 and a plurality of second gate layers 330, which may be alternately stacked under the second conductive plate structure CSLA2. Alternatively or additionally, the second memory cell array MCA2 may include a plurality of second channel structures 340. The second memory cell array MCA2 may be and/or may include the memory cell array MCA described with reference to FIG. 3.

The plurality of first interlayer insulating layers 220 may include, but not be limited to, silicon oxide, silicon nitride, a relatively low-k material, and/or a combination thereof. The plurality of first interlayer insulating layers 220 may include a material different from a material constituting the second insulating layer 270.

The plurality of first gate layers 230 may include, but not be limited to, a metal material such as copper (Cu), aluminum (Al), tungsten (W), silver (Ag), and/or gold (Au). In some embodiments, each of the first gate layers 230 may include a barrier material for preventing the metal material from diffusing into the plurality of first interlayer insulating layers 220, such as, but not limited to, titanium (Ti), tantalum (Ta), titanium nitride (TiN), and/or tantalum nitride (TaN).

The first channel structures 240 may be located in channel holes penetrating the plurality of first interlayer insulating layers 220 and the plurality of first gate layers 230 in the vertical direction (e.g., Z direction). Each of the first channel structures 240 may include a first gate insulating layer 241 on a side surface of the channel hole, a first channel layer 242 on the first gate insulating layer 241, a first buried insulating layer 243 on the first channel layer 242, and a first channel pad 244 filling one end of the channel hole.

The first gate insulating layer 241 may include a blocking insulating layer, a charge storage layer, and a tunneling insulating layer which may be sequentially stacked on the channel hole. The blocking insulating layer may include, for example, silicon oxide (SiO), silicon nitride (SiN), a metal oxide having a higher permittivity than silicon oxide (SiO), and/or a combination thereof. The charge storage layer may include, for example, silicon nitride (SiN), boron nitride (BN), polysilicon, and/or a combination thereof. The tunneling insulating layer may include, for example, metal oxide and/or silicon oxide (SiO).

The first channel layer 242 may surround a side surface and one end of the first buried insulating layer 243. The first channel layer 242 may include a group IV semiconductor material, a group III-V semiconductor material, and/or a group II-VI semiconductor material. In some embodiments, the first channel layer 242 may include polysilicon. However, the present disclosure is not limited in this regard.

The first buried insulating layer 243 may fill a space surrounded by the first channel layer 242 and the first channel pad 244. The first buried insulating layer 243 may include, for example, silicon nitride (SiN), silicon oxide (SiO), a relatively low-k material, and/or a combination thereof. In some embodiments, the first buried insulating layer 243 may include, but not be limited to, silicon oxide (SiO).

The first channel pad 244 may contact the first gate insulating layer 241, the first channel layer 242, and the first buried insulating layer 243. The first channel pad 244 may include, but not be limited to, a semiconductor material (e.g., silicon (Si), germanium (Ge), and/or silicon germanium (SiGe)), a metal material (e.g., tungsten (W), titanium (Ti), aluminum (Al), copper (Cu), gold (Au), and/or silver (Ag)), a metal nitride (e.g., titanium nitride (TiN) and/or tantalum nitride (TaN)), and/or a combination thereof.

The second insulating layer 270 may include, for example, silicon oxide (SiO), silicon nitride (SiN), a relatively low-k material, and/or a combination thereof. The low-k material may be and/or may include a material having a lower dielectric constant (k) than silicon oxide (SiO), such as, but not limited to, PSG, BPSG, FSG, OSG, SOG, and/or a combination thereof.

The first cell array structure CAS1 may include a plurality of first line contacts 280 arranged in a string select line region SSL, a wordline region WL, and a ground select line region GSL. In some embodiments, the plurality of first line contacts 280 may include a plurality of string select line contacts arranged in the string select line region SSL, a plurality of wordline contacts arranged in the wordline region WL, and a plurality of ground select line contacts arranged in the ground select line region GSL.

The plurality of first line contacts 280 may be electrically connected (e.g., coupled) to one of a string select line, a wordline, and a ground select line of the first memory cell array MCA1. The plurality of first line contacts 280 may include a first insulating structure 281 and a first conductive structure 283. Alternatively or additionally, the second cell array structure CAS2 may include a second line contact 380 including a second insulating structure 381 and a second conductive structure 383.

The first cell array structure CAS1 may include the first conductive plate structure CSLA1. The first conductive plate structure CSLA1 may include a first cell plate CSL1 and a plurality of first partition plates CSLR1. Alternatively or additionally, the second cell array structure CAS2 may include the second conductive plate structure CSLA2. The second conductive plate structure CSLA2 may include a second cell plate CSL2 and a plurality of second partition plates CSLR2.

The first cell plate CSL1 may be arranged in a cell region MEC of the first memory cell array MCA1. Alternatively or additionally, the second cell plate CSL2 may be arranged in a cell region MEC of the second memory cell array MCA2. The plurality of first partition plates CSLR1 may be arranged on connection regions other than the cell region MEC of the first memory cell array MCA1 (e.g., string select line region SSL, wordline region WL, ground select line region GSL). Alternatively or additionally, the plurality of second partition plates CSLR2 may be arranged on connection regions other than the cell region MEC of the second memory cell array MCA2. The plurality of first partition plates CSLR1 may be spaced apart from each other in a horizontal direction (e.g., X and/or Y directions). The plurality of second partition plates CSLR2 may be spaced apart from each other in the horizontal direction (e.g., X and/or Y directions).

The second cell array structure CAS2 may include the second memory cell array MCA2, the second conductive plate structure CSLA2 on the second memory cell array MCA2, the third insulating layer 370 at least partially covering the second memory cell array MCA2, and the fourth bonding pads 360a disposed on the third insulating layer 370. The fourth bonding pads 360a may be connected to the third bonding pads 260b of the first cell array structure CAS1.

Alternatively or additionally, the second cell array structure CAS2 may include the plurality of second interlayer insulating layers 320 and the plurality of second gate layers 330 that may be alternatively stacked under the second conductive plate structure CSLA2, and the second channel structures 340 penetrating the plurality of second interlayer insulating layers 320 and the plurality of second gate layers 330. The second channel structure 340 may include a second gate insulating layer 341 on a side surface of the channel hole, a second channel layer 342 on the second gate insulating layer 341, a second buried insulating layer 343 on the second channel layer 342, and a second channel pad 344 filling one end of the channel hole. The second cell array structure CAS2 may correspond and/or may be similar in many respects to the first cell array structure CAS1, and as such, a repeated description of the second cell array structure CAS2 may be omitted for the sake of brevity.

Referring to FIG. 6, a semiconductor memory device 10' may include and/or may be similar in many respects to the semiconductor memory device 10 described above with reference to FIG. 5, and may include additional features not mentioned above. Consequently, repeated descriptions of the semiconductor memory device 10' described above with reference to FIG. 5 may be omitted for the sake of brevity.

As shown in FIG. 6, a third cell array structure CAS3 may be stacked on the second cell array structure CAS2. The second cell array structure CAS2 may include fifth bonding pads 360b. The third cell array structure CAS3 may include a third memory cell array MCA3, a third conductive plate structure CSLA3 on the third memory cell array MCA3, a fourth insulating layer 470 covering the third memory cell array MCA3, and sixth bonding pads 460a arranged on the fourth insulating layer 470. The sixth bonding pads 460a may be connected to the fifth bonding pads 360b of the second cell array structure CAS2. Although the third cell array structure CAS3 is shown as a stepped structure, the present disclosure is not limited in this regard, and the third cell array structure CAS3 may be implemented using other types of structures. For example, the third cell array structure CAS3 may be provided as a reverse stepped structure in which a planar area thereof gradually increases as a distance from the third conductive plate structure CSLA3 increases.

Alternatively or additionally, the third cell array structure CAS3 may include a plurality of third interlayer insulating layers 420 and a plurality of third gate layers 430 which may be alternatively stacked under the third conductive plate structure CSLA3, and a third channel structure 440 penetrating the plurality of third interlayer insulating layers 420 and the plurality of third gate layers 430. The third channel structure 440 may include a third gate insulating layer 441 on a side surface of the channel hole, a third channel layer 442 on the third gate insulating layer 441, a third buried insulating layer 443 on the third channel layer 442, and a third channel pad 444 filling one end of the channel hole. The third cell array structure CAS3 may include the third conductive plate structure CSLA3. The third conductive plate structure CSLA3 may include a third cell plate CSL3 and a plurality of third partition plates CSLR3. The third cell array structure CAS3 may correspond and/or may be similar in many respects to the second cell array structure CAS2, and as such, a repeated description of the third cell array structure CAS3 may be omitted for the sake of brevity.

Figure 7A:
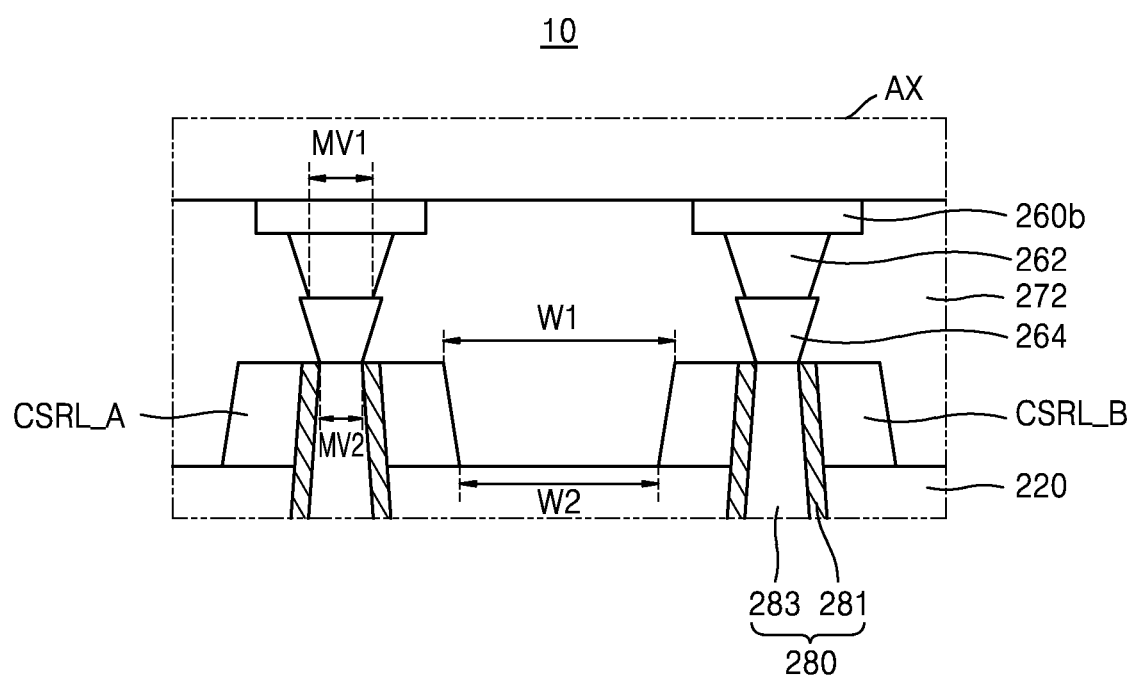
FIGS. 7A and 7B are partially enlarged views of a semiconductor memory device, according to some embodiments.
Figure 7B:
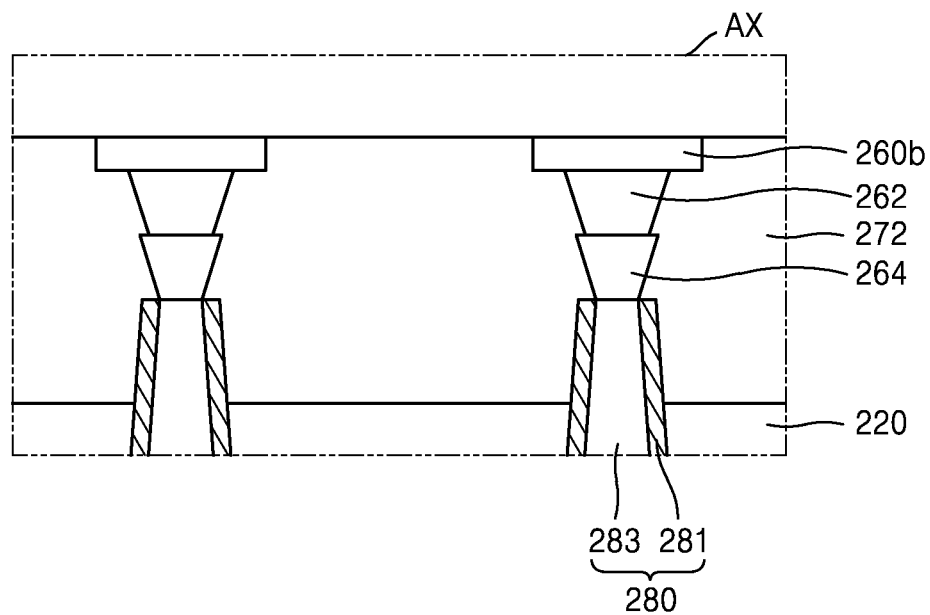

FIGS. 7A and 7B are partially enlarged views of a semiconductor memory device according to some embodiments. FIGS. 7A and 7B are a partially enlarged views of the AX region of the semiconductor memory device 10 of FIG. 5, according to an embodiment. Repeated descriptions of the semiconductor memory device 10 described above with reference to FIG. 5 may be omitted from the description of FIGS. 7A and 7B for the sake of brevity.

Referring to FIGS. 5 and 7A, the second cell array structure CAS2 may include a first via 262 and a second via 264 connecting the first line contact 280 to the third bonding pad 260b. The first via 262 may be connected to the third bonding pad 260b. In an embodiment, a width MV1 of a top surface of the first via 262 may be greater (e.g., wider) than a width MV2 of a top surface of the first conductive structure 283.

Alternatively or additionally, the first line contact 280 may penetrate the first interlayer insulating layer 220 and may partially penetrate a first upper insulating layer 272. The first partition plate CSLR1 may partially surround the first line contact 280. The first partition plate CSLR1 may have a tapered shape in which a width thereof may gradually decrease as the distance from the first interlayer insulating layer 220 increases. For example, a gap between a left partition plate CSRL_A and a right partition plate CSRL_B may have a second width W2 at a top surface of the first interlayer insulating layer 220, and may have a first width W1 at top surfaces of the left partition plate CSRL_A and the right partition plate CSRL_B. In an embodiment, the first width W1 may be greater (e.g., wider) than the second width W2.

Referring to FIG. 7B, the first partition plate CSLR1 on the first interlayer insulating layer 220 may be omitted. The first upper insulating layer 272 may partially cover the first line contact 280. The shape of the first line contact 280 may be equally applied to the second line contact (e.g., second line contact 380 of FIGS. 5 and 6) and the third line contact (e.g., third line contact 480 of FIG. 6).

Figure 8:
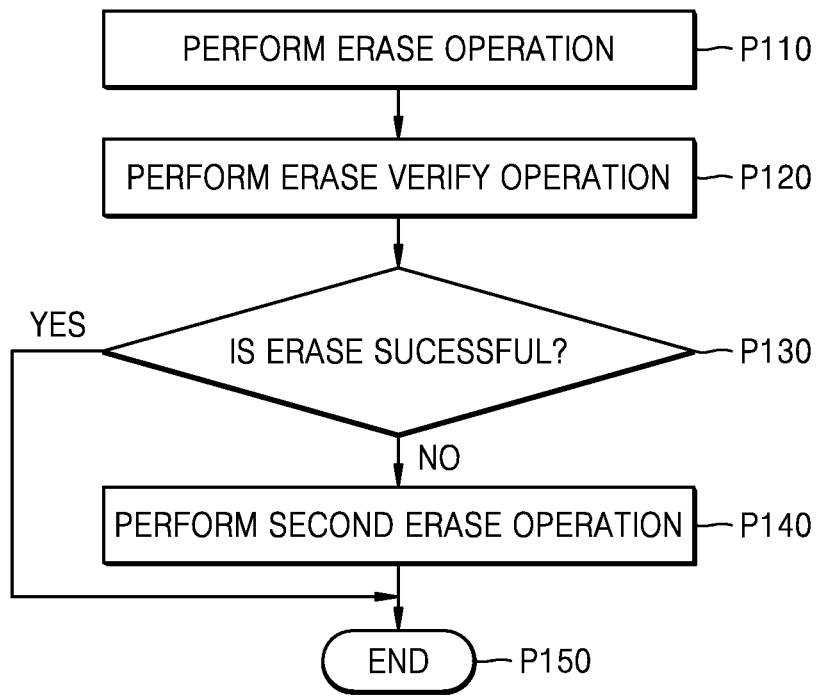
FIG. 8 is a flowchart illustrating an erase operation of a semiconductor memory device, according to some embodiments.

FIG. 8 is a flowchart illustrating an erase operation of a semiconductor memory device, according to some embodiments. FIGS. 9A to 9D are conceptual diagrams illustrating an erase operation of a semiconductor memory device, according to some embodiments. FIG. 10 is a circuit diagram of a semiconductor memory device, according to an embodiment.

Referring to FIG. 8, in an erase operation of the semiconductor memory device 10, an erase operation for erasing data of a memory cell may be performed (operation P110). Thereafter, an erase verify operation may be performed to determine whether the data of the memory cell has been erased (operation P120). When it is determined that the erase operation has failed (NO in operation P130), a second erase operation substantially similar to the operation P110 may be performed (operation P140). The erase verify operation may perform an erase read operation using a reference resistance, a current, and/or a voltage value. Based on the performance of the erase verify operation, when it is determined that the erase operation is successful (YES in operation P130), the erase operation may be terminated (operation P150).

Examples of erase operations, according to some embodiments, are described with reference to FIGS. 9A to 9D and 10.

Figure 9A:
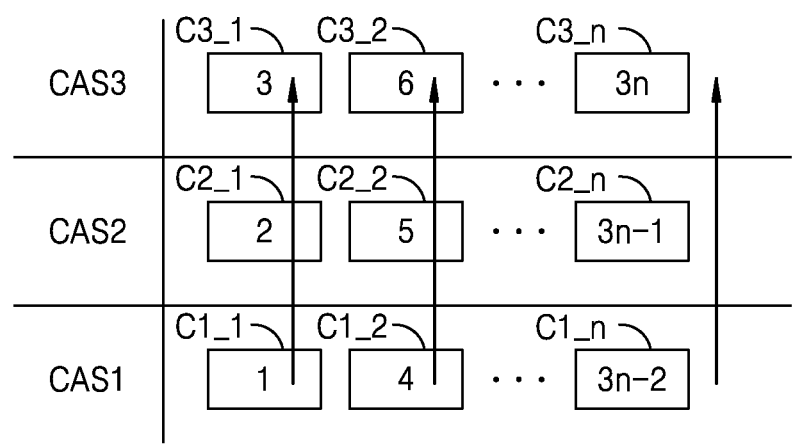
FIGS. 9A to 9D are conceptual diagrams illustrating an erase operation of a semiconductor memory device, according to some embodiments.
Figure 10:
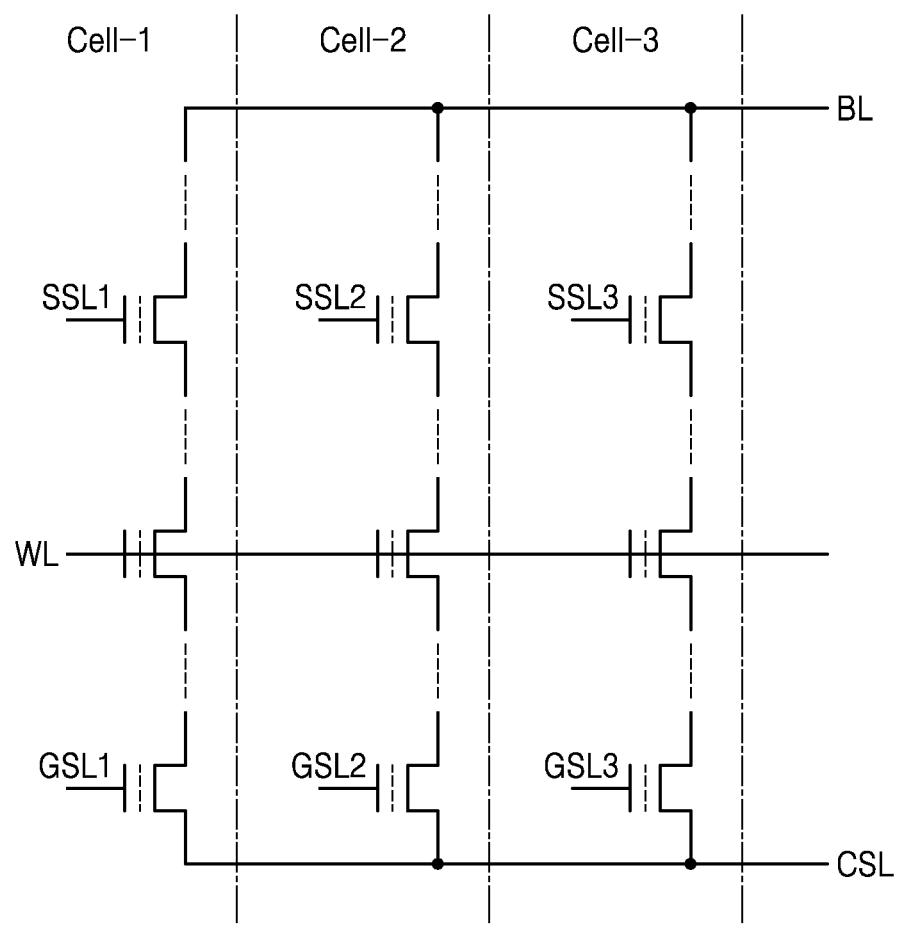
FIG. 10 is a circuit diagram of a semiconductor memory device, according to some embodiments.

Referring to FIGS. 9A and 10, in an embodiment, an erase verify operation may be performed on a 1-1 string select line C1_1 of the first cell array structure CAS1. When it is determined that the erase operation on the 1-1 string select line C1_1 is successful, an erase verify operation may be performed on a 2-1 string select line C2_1 of the second cell array structure CAS2. When it is determined that the erase operation on the 2-1 string select line C2_1 is successful, an erase verify operation may be performed on a 3-1 string select line C3_1 of the third cell array structure CAS3. In an embodiment, the 1-1 string select line C1_1 may be and/or may include n first string select lines in a first block that may constitute an erase unit of the first cell array structure CAS1. Alternatively or additionally, the 2-1 string select line C2_1 may be and/or may include n first string select lines in a second block that may constitute an erase unit of the second cell array structure CAS2. In an optional or additional embodiment, the 3-1 string select line C3_1 may be and/or may include n first string select lines in a third block that may constitute an erase unit of the third cell array structure CAS3. The 1-1 string select line C1_1, the 2-1 string select line C2_1, and the 3-1 string select line C3_1 may correspond to the string select lines SSL1, SSL2 and SSL3 of FIG. 10, respectively.

Continuing to refer to FIG. 9A, an erase verify operation may be performed on a 1-2 string select line C1_2 of the first cell array structure CAS1. In a substantially similar manner as described with reference to string select lines C1_1 to C3_1, an erase verify operation may be performed on a 2-2 string select line C2_2 of the second cell array structure CAS2 and a 3-2 string select line C3_2 of the third cell array structure CAS3. Furthermore, erase verify operations may be iteratively performed on up to a 3-$n$ string select line C3_$n$ of the third cell array structure CAS3.

Figure 9B:
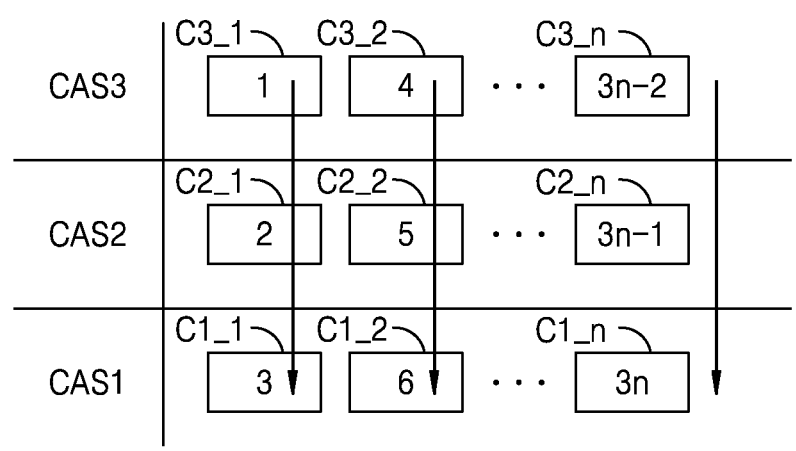

Referring to FIG. 9B, in an optional or additional embodiment, an erase verify operation may be performed on the 3-1 string select line C3_1 of the third cell array structure CAS3. When it is determined that the erase operation on the 3-1 string select line C3_1 is successful, an erase verify operation may be performed on the 2-1 string select line C2_1 of the second cell array structure CAS2. When it is determined that the erase operation on the 2-1 string select line C2_1 is successful, an erase verify operation may be performed on the 1-1 string select line C1_1 of the first cell array structure CAS1. That is, differently to the erase verify operations described with reference to FIG. 9A erase verify operations may be iteratively performed on up to 1-$n$ string select line C1_$n$ of the first cell array structure CAS1.

Figure 9C:
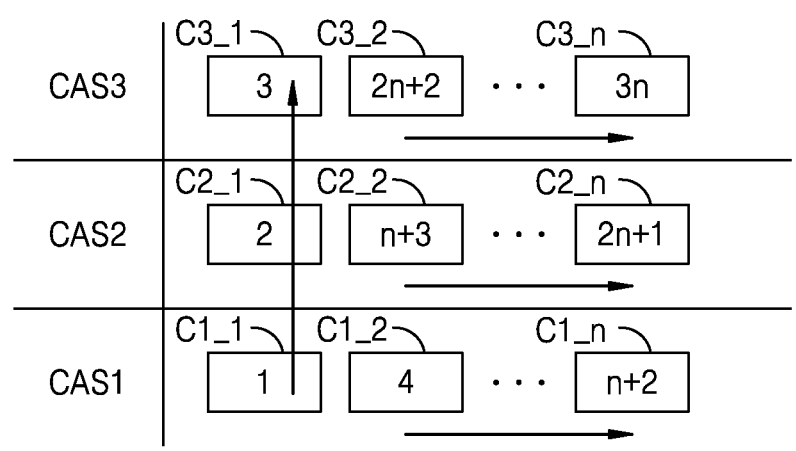

Referring to FIG. 9C, in another optional or additional embodiment, erase verify operations may be performed on the 1-1 string select line C1_1 of the first cell array structure CAS1, the 2-1 string select line C2_1 of the second cell array structure CAS2, and the 3-1 string select line C3_1 of the third cell array structure CAS3 in a substantially similar manner as described with reference to FIG. 9A. Thereafter, erase verify operations may be iteratively performed on all string select lines C1_2 to C1_$n$ except for the 1-1 string select line C1_1 of the first cell array structure CAS1. When it is determined that the erase operation on the 1_$n$ string select line C1_$n$ of the first cell array structure CAS1 is successful, an erase verify operation may be performed on all string select lines C2_2 to C2_$n$ except for the 2-1 string select line C2_1 of the second cell array structure CAS2. When it is determined that the erase operation on the 2_$n$ string select line C2_$n$ of the second cell array structure CAS2 is successful, an erase verify operation may be performed on all string select lines C3_2 to C3_$n$ except for the 3-1 string select line C3_1 of the third cell array structure CAS3.

Figure 9D:
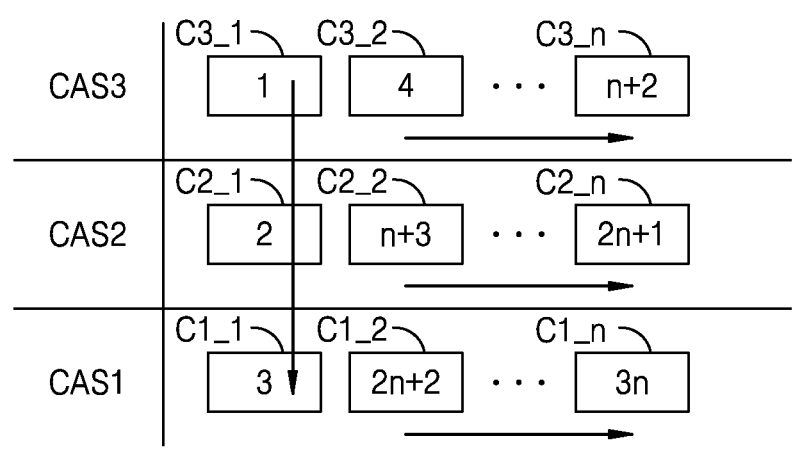

Referring to FIG. 9D, in another optional or additional embodiment, erase verify operations may be performed in a reverse order of FIG. 9C. That is, erase verify operations may be performed on the 3-1 string select line C3_1 of the third cell array structure CAS3, the 2-1 string select line C2_1 of the second cell array structure CAS2, and the 1-1 string select line C1_1 of the first cell array structure CAS1. Thereafter, erase verify operations may be iteratively performed on all string select lines C3_2 to C3_$n$ except for the 3-1 string select line C3_1 of the third cell array structure CAS3, all string select lines C2_2 to C2_$n$ except for the 2-1 string select line C2_1 of the second cell array structure CAS2, and all string select lines C1_2 to C1_$n$ except for the 1-1 string select line C1_1 of the first cell array structure CAS1.

Referring to FIG. 10, in some embodiments, when an erase verify operation is performed, a first voltage applied to a first string select line SSL1 of the first memory cell array MCA1 may be higher or lower (e.g., different) than a second voltage applied to a second string select line SSL2 of the second memory cell array MCA2. Alternatively or additionally, when an erase operation and/or an erase verify operation is performed, a third voltage applied to a third string select line SSL3 of the third memory cell array MCA3 may be different from the first voltage and the second voltage. Similarly, when an erase operation and/or an erase verify operation is performed, the third voltage applied to a first ground select line GSL1 of the first memory cell array MCA1 may be higher and/or lower than a fourth voltage applied to a second ground select line GSL2 of the second memory cell array MCA2. Alternatively or additionally, a fifth voltage applied to a third ground select line GSL3 of the third memory cell array MCA3 may be different from the third voltage and the fourth voltage.

Figure 11A:
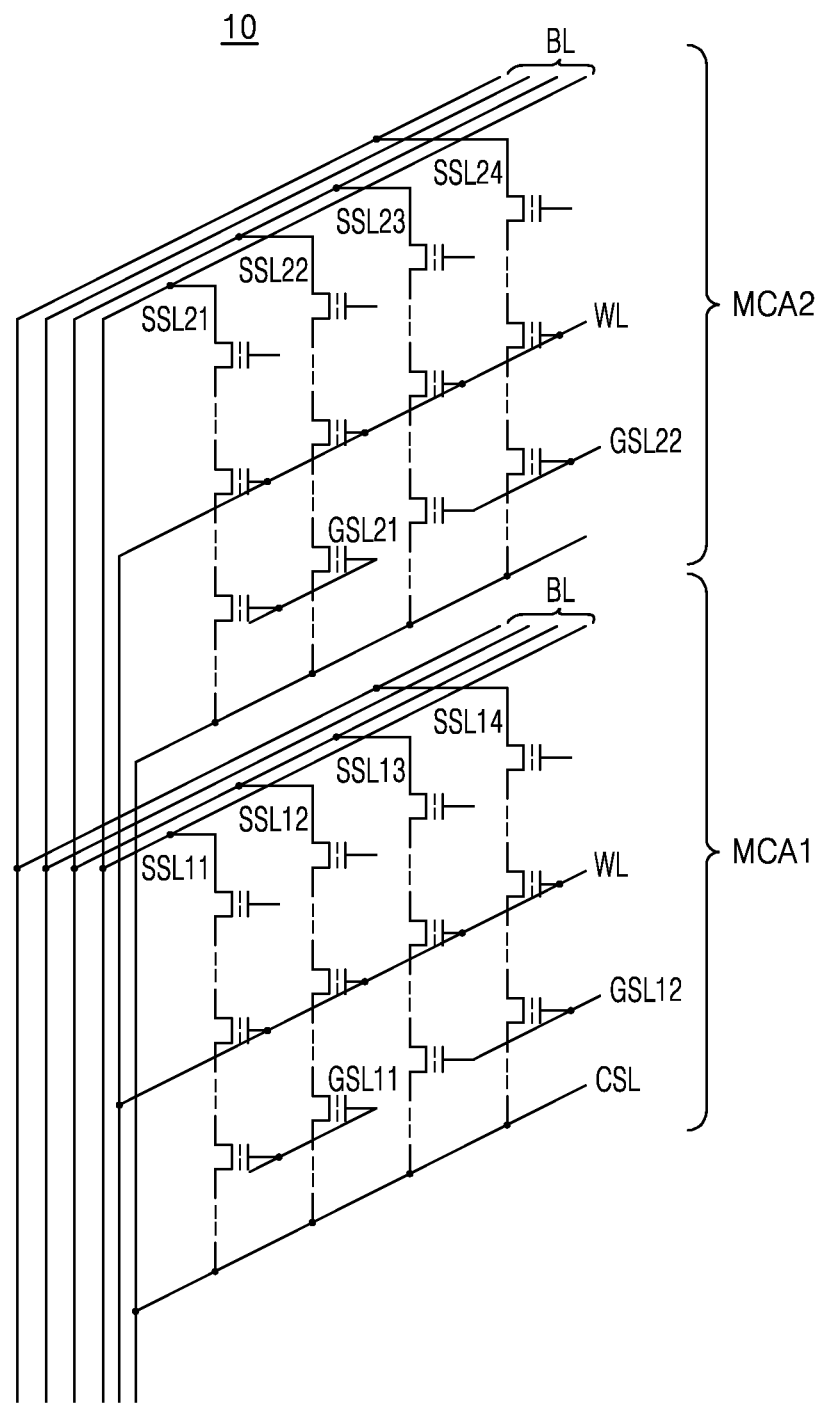
FIGS. 11A to 11C are circuit diagrams of a semiconductor memory device, according to some embodiments.
Figure 11B:
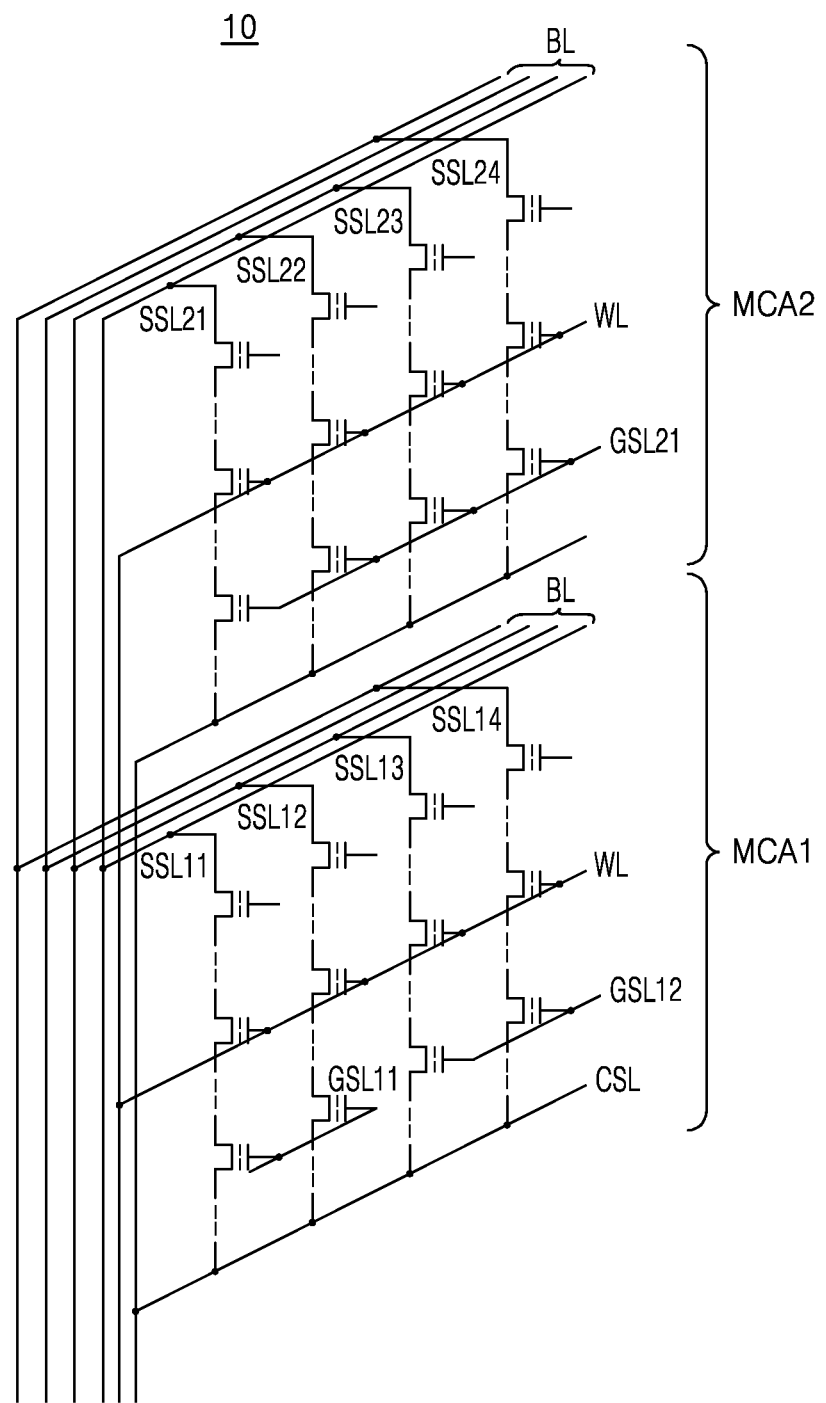
Figure 11C:
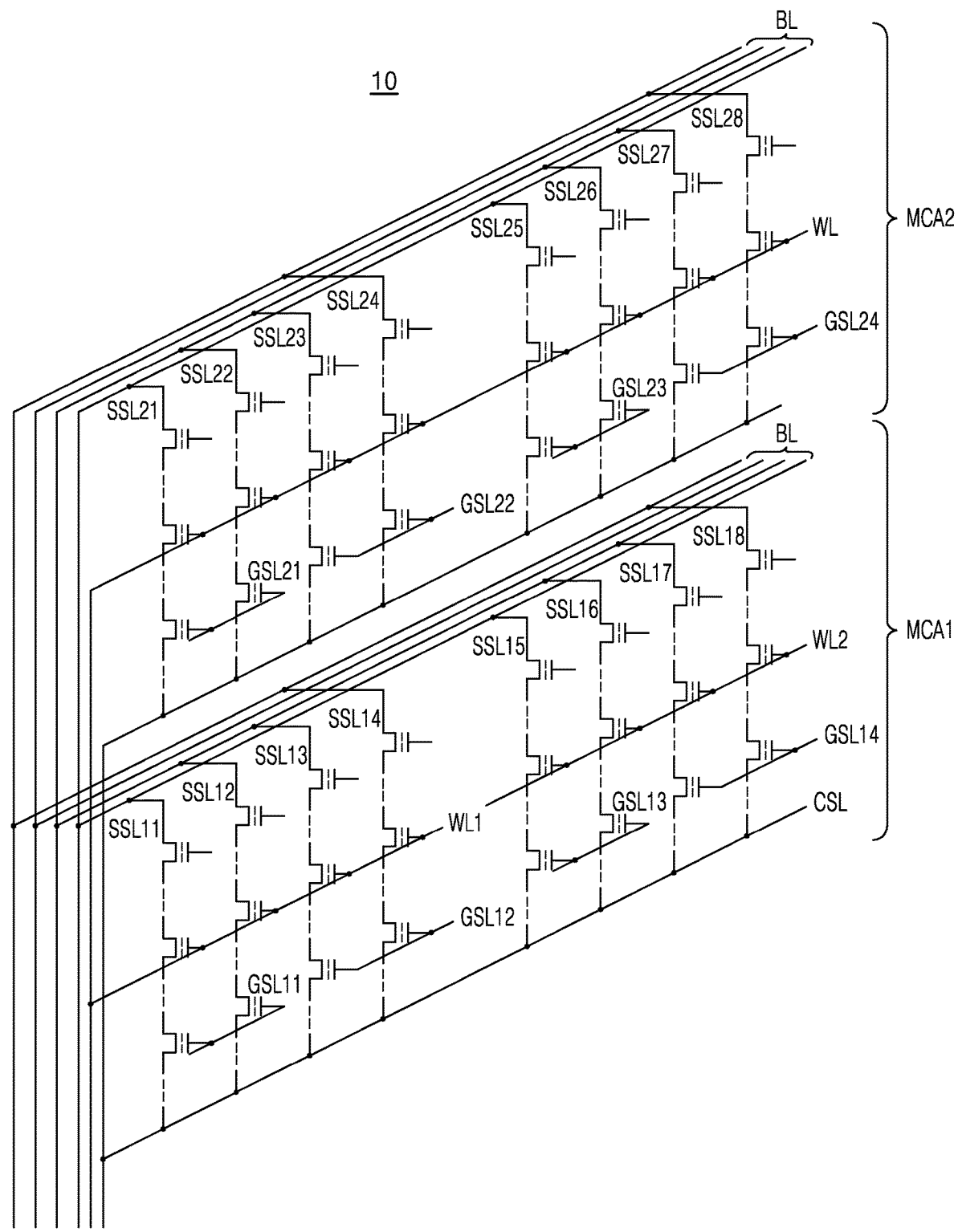

FIGS. 11A to 11C are circuit diagrams of the semiconductor memory device 10, according to an embodiment. Repeated descriptions of the semiconductor memory device 10 described above with reference to FIG. 5 may be omitted from the description of FIGS. 11A to 11C for the sake of brevity.

Referring to FIG. 11A, in some embodiments, a first wordline WL of the first memory cell array MCA1 may be connected to a second wordline WL of the second memory cell array MCA2. Alternatively or additionally, a first ground select line GSL11 of the first memory cell array MCA1 may be connected to some of a plurality of first cell strings of the first memory cell array MCA1, and second ground select lines GSL12 of the first memory cell array MCA1 may be connected to the remaining first cell strings of the plurality of first cell strings MCA1. As another example, third ground select lines GSL21 of the second memory cell array MCA2 may be connected to some of a plurality of second cell strings, and fourth ground select lines GSL22 of the second memory cell array MCA2 may be connected to the remaining second cell strings of the plurality of second cell strings.

Referring to FIG. 11B, in some embodiments, a wordline WL of the first memory cell array MCA1 may be connected to a wordline WL of the second memory cell array MCA2. The first ground select lines GSL11 of the first memory cell array MCA1 may be connected to some of the plurality of first cell strings of the first memory cell array MCA1, and the second ground select lines GSL12 of the first memory cell array MCA1 may be connected to the remaining first cell strings of the plurality of first cell strings MCA1. Third ground select lines GSL21 of the second memory cell array MCA2 may be connected to the plurality of second cell strings having a different number from the first ground select lines GSL11 of the first memory cell array MCA1 or the second ground select lines GSL12 of the first memory cell array MCA1. For example, the number of the second cell strings of the second memory cell array MCA2 connected to the third ground select lines GSL21 of the second memory cell array MCA2 ($N_{GSL21}$) may be equal to the number of the first cell strings of the first memory cell array MCA1 connected to the first ground select lines GSL11 of the first memory cell array MCA1 ($N_{GSL11}$) added to the number of the first cell strings of the first memory cell array MCA1 connected to the second ground select lines GSL12 of the first memory cell array MCA1 ($N_{GSL12}$). That is, $N_{GSL21}=N_{GSL11}+N_{GSL12}$.

Referring to FIG. 11C, in some embodiments, the first memory cell array MCA1 may include a first wordline WL1 and a second wordline WL2. In such embodiments, the first wordline WL1 may not be connected to the second wordline WL2. Alternatively or additionally, the second memory cell array MCA2 may include a third wordline WL, and the third wordline WL may be connected to the first wordline WL1 of the first memory cell array MCA1. In such embodiments, the third wordline WL may not be connected to the second wordline WL2.

FIGS. 12A to 12E are cross-sectional views illustrating a method of manufacturing a semiconductor memory device, according to an embodiment.

Figure 12A:
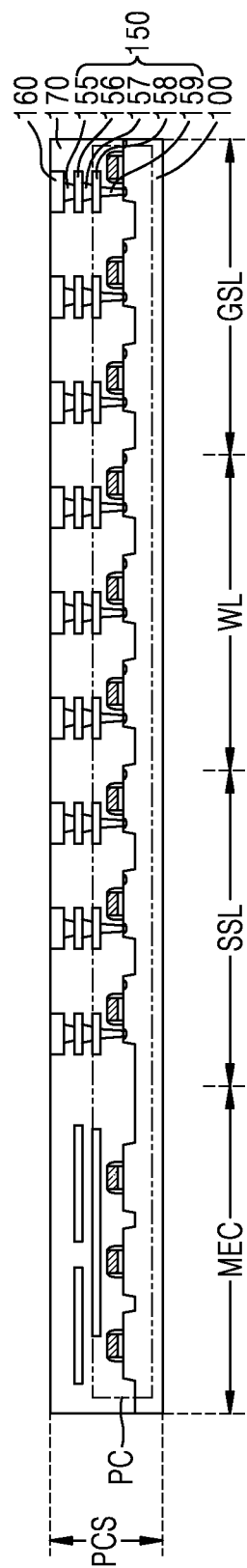
FIGS. 12A to 12E are cross-sectional views illustrating a method of manufacturing a semiconductor memory device, according to some embodiments.

Referring to FIG. 12A, a peripheral circuit structure PCS including a circuit board 100 may be formed. The peripheral circuit structure PCS may include a peripheral circuit PC on an upper surface of the circuit board 100, a first insulating layer 170 covering the circuit board 100 and the peripheral circuit PC, and first bonding pads 160 disposed on the first insulating layer 170. Alternatively or additionally, the peripheral circuit structure PCS may include a first wiring structure 150.

Figure 12B:
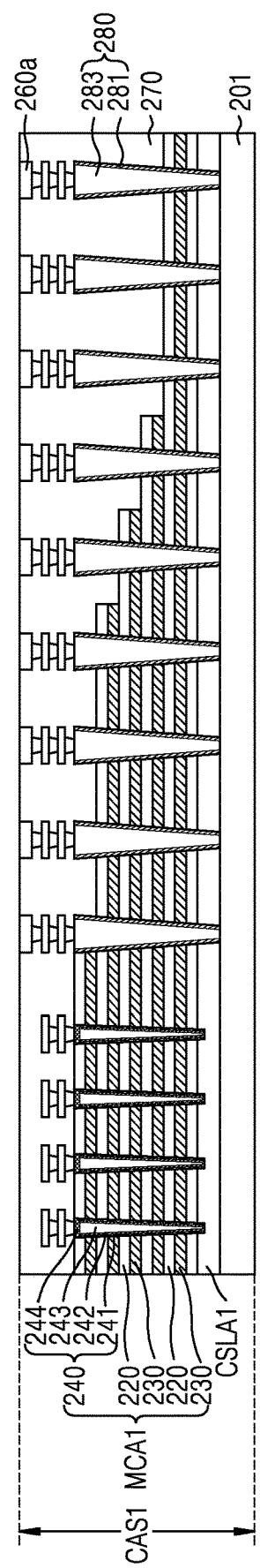

Referring to FIG. 12B, a part of the first cell array structure CAS1 (e.g., first cell array structure CAS1 of FIG. 5) may be formed on a carrier substrate 201. The part of the first cell array structure CAS1 may be formed before a first conductive plate structure CSLA1 is formed. In an embodiment, an insulating layer may be formed between the carrier substrate 201 and the first conductive plate structure CSLA1 (not shown). Alternatively or additionally, a via connecting the carrier substrate 201 and the first conductive plate structure CSLA1 may be formed (not shown).

Figure 12C:
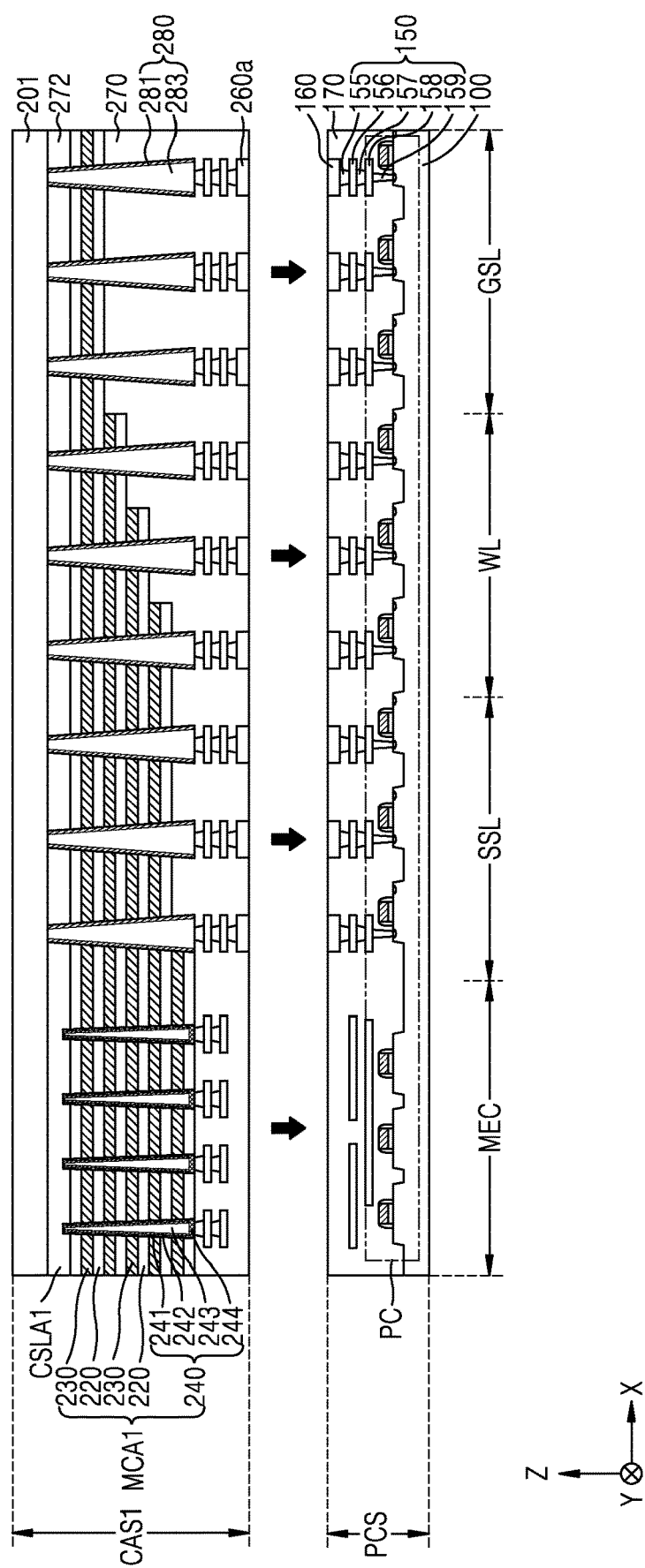

Referring to FIG. 12C, after the first cell array structure CAS1 of FIG. 12B is arranged to at least partially overlap the peripheral circuit structure PCS of FIG. 12A in the vertical direction (e.g., Z direction), the first bonding pads 160 included in the peripheral circuit structure PCS may be bonded to the second bonding pads 260a included in the structure of FIG. 12B.

In some embodiments, before bonding the first bonding pads 160 to the second bonding pads 260a, to strengthen the bonding strength therebetween, a surface treatment process, such as, but not limited to, a hydrogen, argon, oxygen plasma treatment, may be further performed on the surface of the first cell array structure CAS1 where the first bonding pads 160 are exposed and the surface of the peripheral circuit structure PCS where the second bonding pads 260a are exposed.

Continuing to refer to FIG. 12C, in some embodiments, the first bonding pads 160 included in the peripheral circuit structure PCS may be directly bonded to the second bonding pads 260a included in the first cell array structure CAS1, without a separate bonding layer, by pressing the first bonding pads 160 in the direction of the arrows. For example, when the first bonding pads 160 face the second bonding pads 260a, the first bonding pads 160 may be bonded to the second bonding pads 260a by pressing the two in a direction in which they come closer to each other to form bonds at an atomic level.

In some embodiments, the first bonding pads 160 included in the peripheral circuit structure PCS and the second bonding pads 260a included in the first cell array structure CAS1 may have enhanced adhesive strength by bonding through a layer that may accelerate a chemical reaction.

Figure 12D:
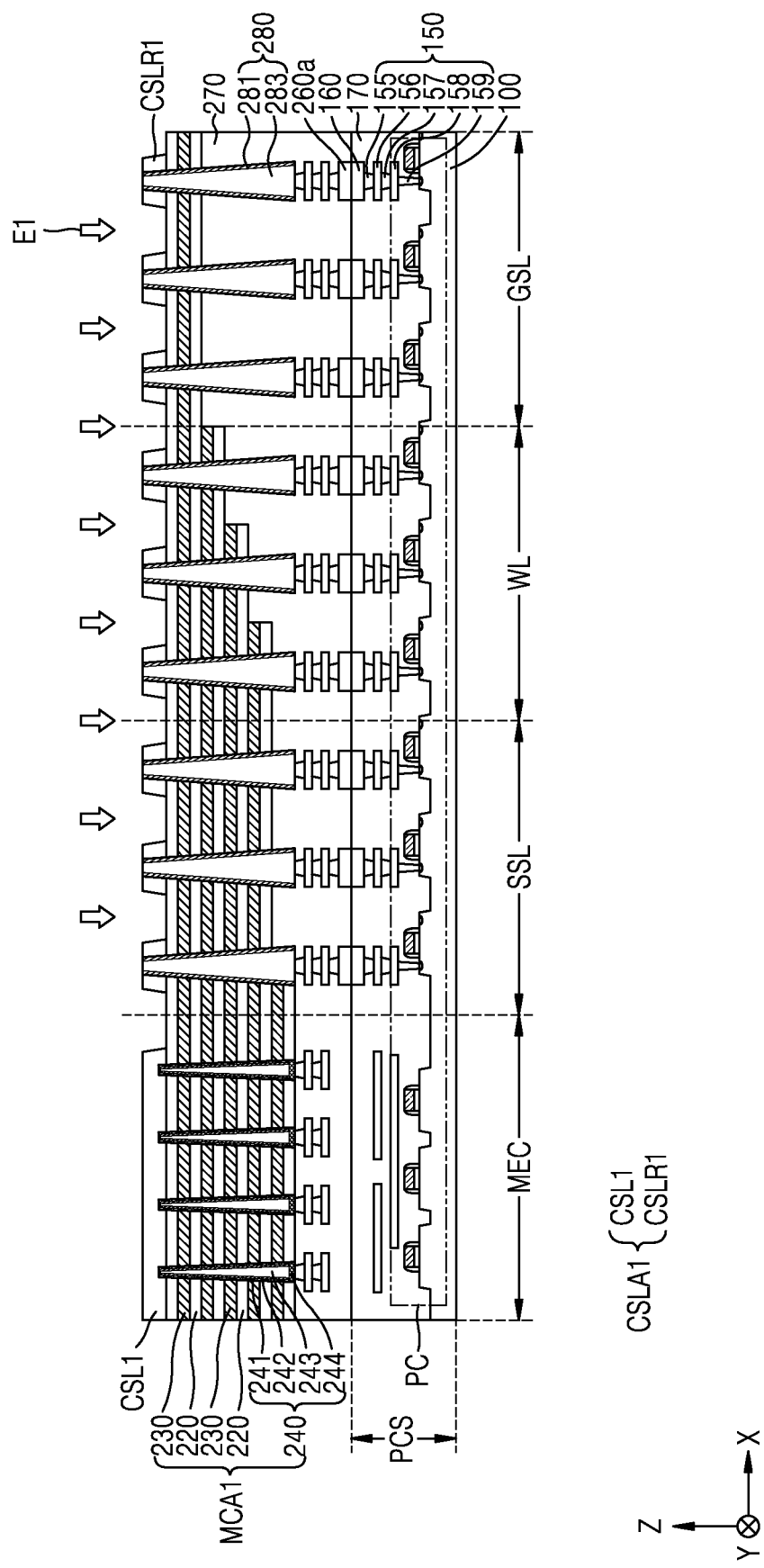
Figure 12E:
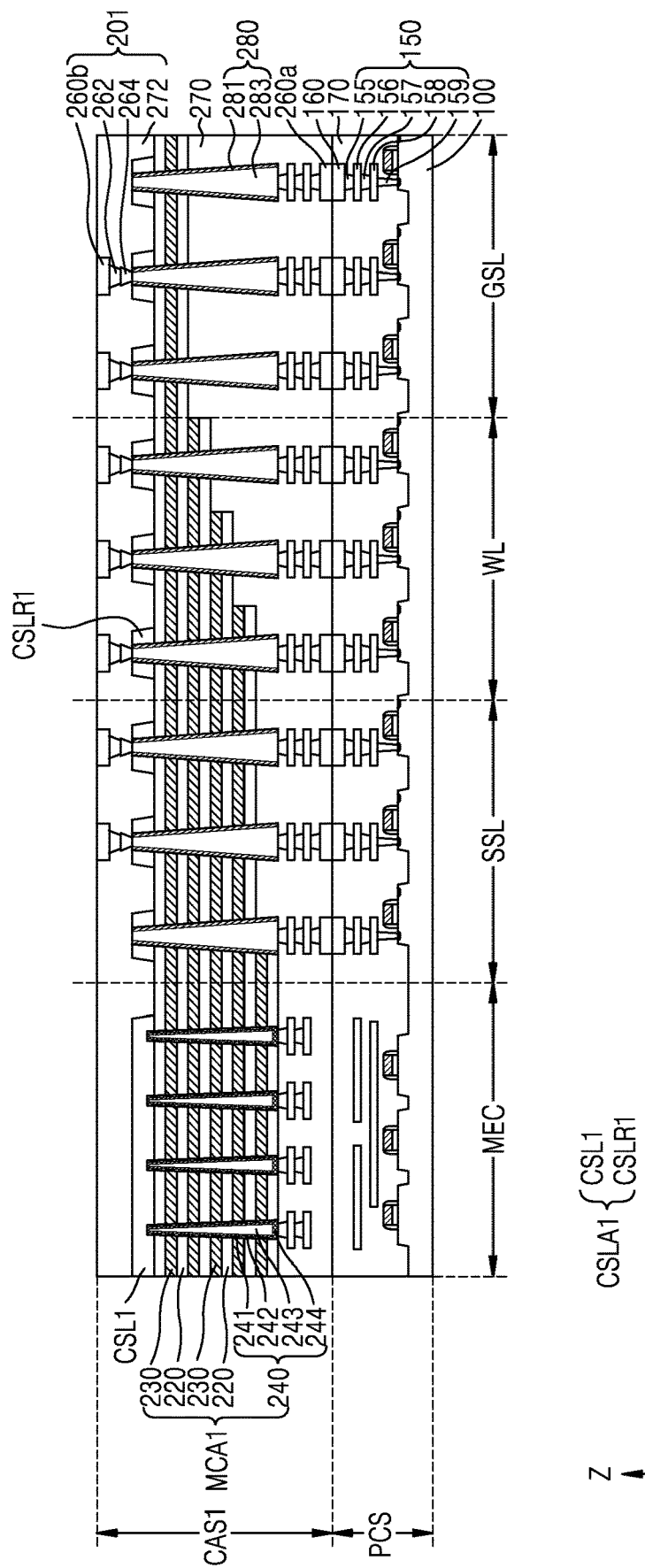

Referring to FIGS. 12D and 12E, after removing the carrier substrate 201 to expose and etch E1, the first conductive plate structure CSLA1, the first conductive plate structure CSLA1 may be formed on the first memory cell array MCA1 conformally, and the first conductive plate CSL1 and the plurality of first partition plates CSLR1 may be formed and separated. The first upper insulating layer 272 may be formed on a separation region from which the first conductive plate CSL1 may be separated, and a plurality of vias and a plurality of pads (e.g., second via 264, first via 262, and third bonding pad 260b) may be formed thereon.

Referring to FIG. 5, the semiconductor memory device may be completed by stacking the second cell array structure CAS2 without forming the plurality of vias and the plurality of pads (e.g., second via 264, first via 262, and third bonding pad 260b) in FIG. 12E. Similarly, referring to FIG. 6, the semiconductor memory device may be completed by stacking the second cell array structure CAS2 and then stacking the third cell array structure CAS3 without forming the plurality of vias and the plurality of pads (e.g., second via 264, first via 262, and third bonding pad 260b) in FIG. 12E.

FIG. 13 is a diagram of an electronic system including a semiconductor memory device, according to an embodiment.

Referring to FIG. 13, the electronic system 1000 may include a semiconductor memory device 1100, and a controller 1200 that may be electrically connected to the semiconductor memory device 1100.

The electronic system 1000 may be and/or may include a storage device including the semiconductor memory device 1100 and/or an electronic device including the storage device. For example, the electronic system 1000 may be a solid state drive (SSD) device, a universal serial bus (USB), a computing system, a medical device, and/or a communication device, including at least one semiconductor memory device 1100.

The semiconductor memory device 1100 may be and/or may include a non-volatile vertical memory device. For example, the semiconductor memory device 1100 may be and/or may include a NAND flash memory device including at least one of the semiconductor memory devices 1, 10, and 10' described with reference to FIGS. 4 to 11. The semiconductor memory device 1100 may include a first structure 1100F, and a second structure 1100S on the first structure 1100F. In some embodiments, the first structure 1100F may be located next to the second structure 1100S. The first structure 1100F may be a peripheral circuit structure including a decoder circuit 1110, a page buffer 1120, and a logic circuit 1130. The second structure 1100S may be a memory cell structure including bitlines BL, a common source line CSL, a plurality of wordlines WL, first and second gate upper lines UL1 and UL2, first and second gate lower lines LL1 and LL2, and a plurality of memory cell strings CSTR between the bitlines BL and the common source line CSL.

In the second structure 1100S, the plurality of memory cell strings CSTR may include lower transistors LT1 and LT2 adjacent to the common source line CSL, upper transistors UT1 and UT2 adjacent to the bitlines BL, and a plurality of memory cell transistors MCT between the lower transistors LT1 and LT2 and the upper transistors UT1 and UT2. The number of lower transistors LT1 and LT2 and the number of upper transistors UT1 and UT2 may be variously modified according to some embodiments.

In some embodiments, the upper transistors UT1 and UT2 may include string select transistors, and the lower transistors LT1 and LT2 may include ground select transistors. The plurality of gate lower lines LL1 and LL2 may be gate electrodes of the lower transistors LT1 and LT2, respectively. The wordlines WL may be gate electrodes of the memory cell transistor MCT, and the gate upper lines UL1 and UL2 may be gate electrodes of the upper transistors UT1 and UT2.

The common source line CSL, the plurality of gate lower lines LL1 and LL2, the plurality of wordlines WL, and the plurality of gate upper lines UL1 and UL2 may be electrically connected to the decoder circuit 1110 through a plurality of first connection circuits 1115 extending from the first structure 1100F to the second structure 1100S. The plurality of bitlines BL may be electrically connected to the page buffer 1120 through a plurality of second connection wires 1125 extending from the first structure 1100F to the second structure 1100S.

In the first structure 1100F, the decoder circuit 1110 and the page buffer 1120 may execute a control operation on at least one of the plurality of memory cell transistors MCT. The decoder circuit 1110 and the page buffer 1120 may be controlled by the logic circuit 1130.

The semiconductor memory device 1100 may communicate with the controller 1200 through I/O pads 1101 that may be electrically connected to the logic circuit 1130. The I/O pads 1101 may be electrically connected to the logic circuit 1130 through I/O connection wires 1135 extending from the first structure 1100F to the second structure 1100S.

The controller 1200 may include a processor 1210, a NAND controller 1220, and a host interface 1230. In some embodiments, the electronic system 1000 may include a plurality of semiconductor memory devices 1100, where the controller 1200 may control the plurality of semiconductor memory devices 1100.

The processor 1210 may control the overall operation of the electronic system 1000 including the controller 1200. The processor 1210 may operate according to certain firmware, software, program code, executable code, and the like. Alternatively or additionally, the processor 1210 may access the semiconductor memory device 1100 by controlling the NAND controller 1220. The NAND controller 1220 may include a NAND interface (I/F) 1221 that may process and/or perform communication with the semiconductor memory device 1100. For example, the NAND controller 1220 may transmit, through the NAND interface 1221, a control command for controlling the semiconductor memory device 1100, data to be written to the plurality of memory cell transistors MCT of the semiconductor memory device 1100, data to be read from the plurality of memory cell transistors MCT of the semiconductor memory device 1100, and the like. The host interface (I/F) 1230 may provide a communication function between the electronic system 1000 and an external host. For example, when a control command is received from the external host through the host interface 1230, the processor 1210 may control the semiconductor memory device 1100 in response to the control command.

Figure 14:
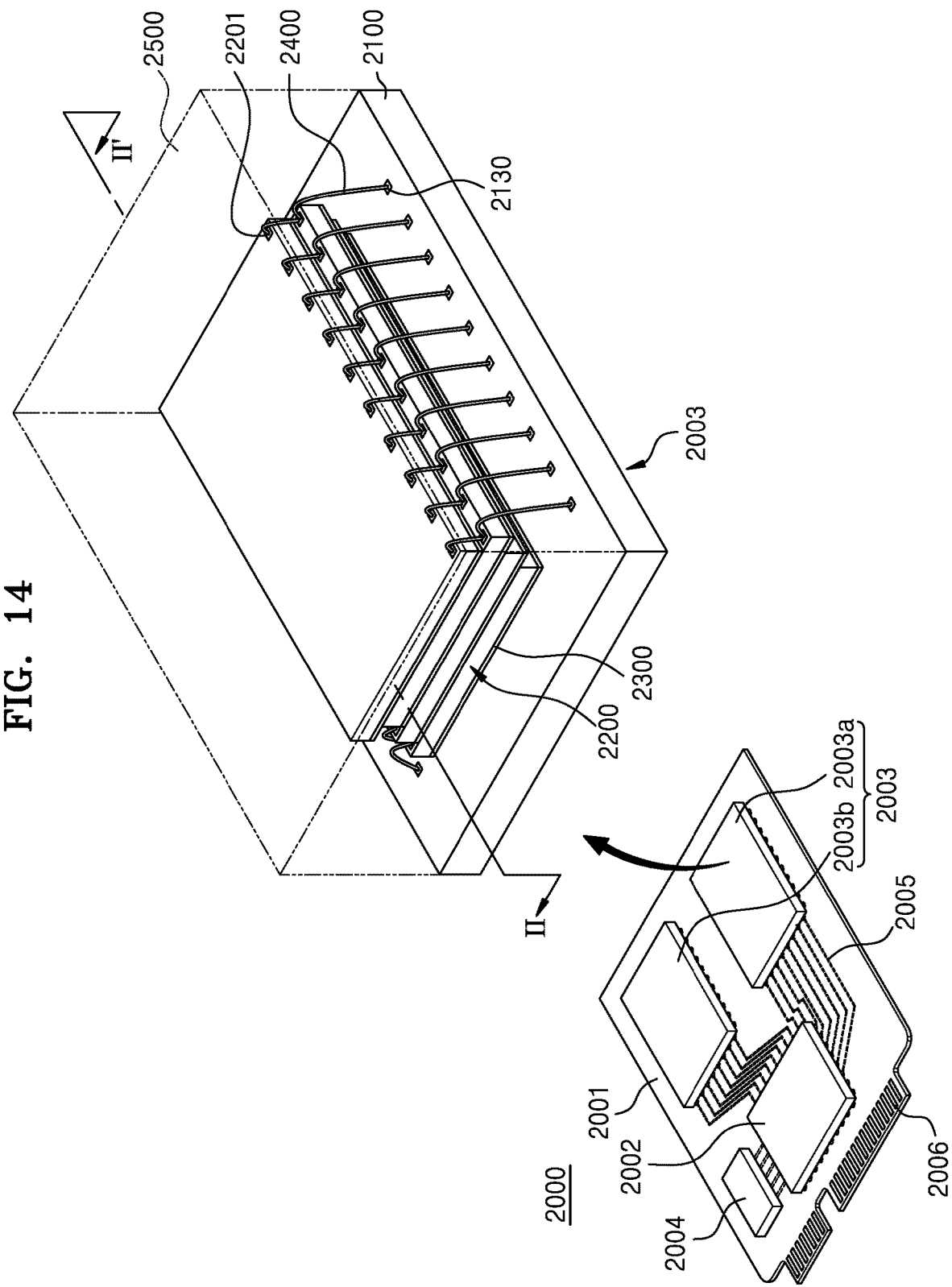
FIG. 14 is a perspective view of an electronic system including a semiconductor memory device, according to some embodiments.

FIG. 14 is a perspective view of an electronic system including a semiconductor memory device, according to an embodiment.

Referring to FIG. 14, according to an embodiment, the electronic system 2000 may include a main board 2001, a controller 2002 mounted on the main board 2001, one or more semiconductor packages 2003 (e.g., first semiconductor package 2003a, second semiconductor package 2003b), and a DRAM 2004. The semiconductor packages 2003 and the DRAM 2004 may be connected to the controller 2002 by a plurality of wiring patterns 2005 formed on the main board 2001.

The main board 2001 may include a connector 2006 including a plurality of pins coupled to an external host. The number and arrangement of the plurality of pins in the connector 2006 may vary according to a communication interface between the electronic system 2000 and the external host. In some embodiments, the electronic system 2000 may communicate with the external host according to at least one of interfaces such as, but not limited to, USB, peripheral component interconnect express (PCI-Express), serial advanced technology attachment (SATA), M-Phy for universal flash storage (UFS), and the like. In some embodiments, the electronic system 2000 may be operated by power supplied from the external host through the connector 2006. The electronic system 2000 may further include a power management integrated circuit (PMIC) that may distribute the power supplied from the external host to the controller 2002 and the semiconductor packages 2003.

The controller 2002 may write data to the semiconductor packages 2003 and/or read data from the semiconductor packages 2003, and may potentially improve the operating speed of the electronic system 2000.

The DRAM 2004 may be and/or may include a buffer memory for mitigating a speed difference between the semiconductor packages 2003 and the external host. Alternatively or additionally, the DRAM 2004 may operate as a cache memory, and as such, may provide a space for temporarily storing data in a control operation on the semiconductor packages 2003. When the electronic system 2000 includes the DRAM 2004, the controller 2002 may further include a DRAM controller for controlling the DRAM 2004 in addition to the NAND controller for controlling the semiconductor package 2003.

The semiconductor packages 2003 may include the first and second semiconductor packages 2003a and 2003b. In an embodiment, the first and second semiconductor packages 2003a and 2003b may be spaced apart from each other. Each of the first and second semiconductor packages 2003a and 2003b may be and/or may include a semiconductor package including a plurality of semiconductor chips 2200. For example, each of the first and second semiconductor packages 2003a and 2000b may include a package substrate 2100, the plurality of semiconductor chips 2200 on the package substrate 2100, an adhesive layer 2300 disposed on a lower surface of each of the plurality of semiconductor chips 2200, a connection structure 2400 electrically connecting the plurality of semiconductor chips 2200 and the package substrate 2100, and a molding layer 2500 covering the plurality of semiconductor chips 2200 and the connection structure 2400 on the package substrate 2100.

The package substrate 2100 may be and/or may include a printed circuit board that may include a plurality of package upper pads 2130. Each of the plurality of semiconductor chips 2200 may include I/O pads 2201. The I/O pads 2201 may correspond to the I/O pads 1101 described with reference to FIG. 13. Each of the plurality of semiconductor chips 2200 may include at least one of the semiconductor memory devices 1, 10, and 10' described with reference to FIGS. 4 to 11.

In some embodiments, the connection structure 2400 may be and/or may include bonding wiring which may electrically connect the I/O pads 2201 to the package upper pads 2130. Accordingly, in the first and second semiconductor packages 2003a and 2003b, the plurality of semiconductor chips 2200 may be electrically connected to each other using a bonding wire method, and/or may be electrically connected to the package upper pads 2130 of the package substrate 2100. In some optional or additional embodiments, in the first and second semiconductor packages 2003a and 2003b, the plurality of semiconductor chips 2200 may be electrically connected to each other by a connection structure including through silicon vias (TSVs).

In some embodiments, the controller 2002 and the plurality of semiconductor chips 2200 may be included in one package. In some optional or additional embodiments, the controller 2002 and the plurality of semiconductor chips 2200 may be mounted on a separate interposer substrate different from the main board 2001, and the controller 2002 may be connected to the plurality of semiconductor chips 2200 by wires formed on the interposer substrate.

Figure 15:
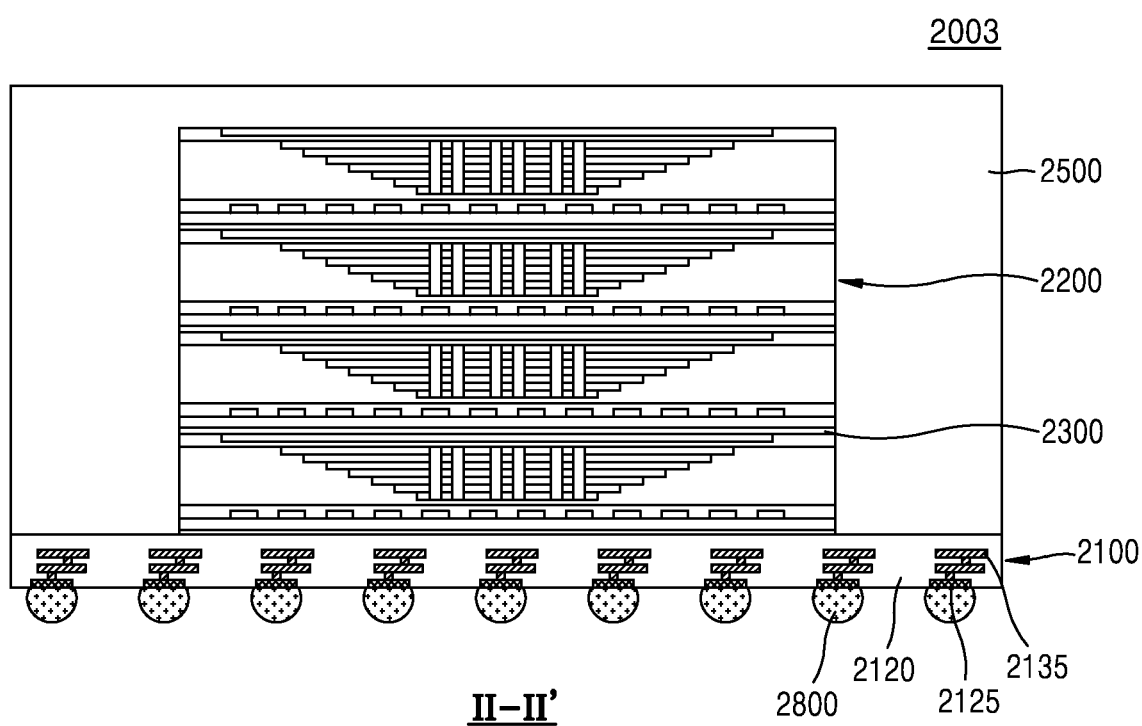
FIG. 15 is a cross-sectional view of a semiconductor package including a semiconductor memory device, according to some embodiments.

FIG. 15 is a cross-sectional view of a semiconductor package including a semiconductor memory device, according to an embodiment.

Referring to FIG. 15, in the semiconductor package 2003, the package substrate 2100 may be a printed circuit board.

The package substrate 2100 may include a body 2120, package upper pads 2130 (e.g., package upper pads 2130 of FIG. 14) disposed on an upper surface of the body 2120, package lower pads 2125 disposed on or exposed through a lower surface of the body 2120, and internal wiring 2135 electrically connecting the package upper pads 2130 and the package lower pads 2125 inside the body 2120.

The plurality of lower pads 2125 may be connected to the plurality of wiring patterns 2005 on the main board 2001 (e.g., main board 2001 of FIG. 14) through a plurality of conductive bumps 2800. Each of the plurality of semiconductor chips 2200 may include at least one of the semiconductor memory devices 1, 10, and 10' described with reference to FIGS. 4 to 11.

While the present disclosure has been particularly shown and described with reference to embodiments thereof, it may be understood that various changes in form and details may be made therein without departing from the spirit and scope of the following claims.

What is claimed is:

1. A semiconductor memory device, comprising:
   a peripheral circuit structure comprising a circuit board, a peripheral circuit on the circuit board, a first insulating layer partially covering the peripheral circuit, and a plurality of first bonding pads on the first insulating layer;
   a first cell array structure comprising a first memory cell array, a first conductive plate structure on the first memory cell array, a second insulating layer partially covering the first memory cell array, a plurality of second bonding pads on the second insulating layer, and a plurality of third bonding pads on the second insulating layer; and
   a second cell array structure stacked on the first cell array structure, and comprising a second memory cell array, a second conductive plate structure on the second memory cell array, a third insulating layer partially covering the second memory cell array, and a plurality of fourth bonding pads on the third insulating layer,
   wherein the first cell array structure and the second cell array structure are sequentially stacked in a vertical direction on the peripheral circuit structure,
   wherein the plurality of first bonding pads respectively contact the plurality of second bonding pads,
   wherein the plurality of third bonding pads respectively contact the plurality of fourth bonding pads,
   wherein the first memory cell array comprises:
      a plurality of first wordlines; and
      a first stepped structure in which a first planar area of the first stepped structure gradually decreases as a first distance from the first conductive plate structure increases,
   wherein the second memory cell array comprises:
      a plurality of second wordlines; and
      a second stepped structure in which a second planar area of the second stepped structure gradually decreases as a second distance from the second conductive plate structure increases,
   wherein the first cell array structure further comprises a first wordline contact coupled to a first wordline of the plurality of first wordlines of the first memory cell array,
   wherein the second cell array structure further comprises a second wordline contact coupled to a second wordline of the plurality of second wordlines of the second memory cell array, and
   wherein the first wordline contact is electrically coupled to the second wordline contact.

2. The semiconductor memory device of claim 1, wherein the first cell array structure further comprises a first via and a second via which couple the first wordline contact to the plurality of third bonding pads, and
   wherein the first via is disposed between the plurality of third bonding pads and the second via.

3. The semiconductor memory device of claim 2, wherein a first width of a lower surface of the first via is greater than a second width of an upper surface of the first wordline contact.

4. The semiconductor memory device of claim 1, wherein the first wordline contact penetrates the plurality of first wordlines of the first cell array structure, and
wherein the second wordline contact penetrates the plurality of second wordlines of the second cell array structure.

5. The semiconductor memory device of claim 1, wherein a first central axis of the first wordline contact corresponds with a second central axis of the second wordline contact in the vertical direction.

6. The semiconductor memory device of claim 1, wherein the first memory cell array is configured to perform, during a memory erase operation of the semiconductor memory device and after performance of a first erase verify operation of a first string select line of a plurality of first string select lines of the first memory cell array, a second erase verify operation of remaining first string select lines of the plurality of first string select lines of the first memory cell array, and
wherein the second memory cell array is configured to perform, during the memory erase operation of the semiconductor memory device and after performance of a third erase verify operation of a second string select line of a plurality of second string select lines of the second memory cell array, a fourth erase verify operation of remaining second string select lines of the plurality of second string select lines of the second memory cell array.

7. The semiconductor memory device of claim 1, wherein the second memory cell array is configured to perform, during a memory erase operation of the semiconductor memory device, a first erase verify operation of a second string select line of a plurality of second string select lines of the second memory cell array prior to a second erase verify operation of a first string select line of a plurality of first string select lines of the first memory cell array.

8. The semiconductor memory device of claim 1, wherein the first memory cell array is configured to apply, during a memory erase operation of the semiconductor memory device, a first voltage to first string select lines on which a first erase verify operation of the first memory cell array is performed,
wherein the second memory cell array is configured to apply, during the memory erase operation of the semiconductor memory device, a second voltage to second string select lines on which a second erase verify operation of the second memory cell array is performed, and
wherein a first level of the first voltage is different from a second level of the second voltage applied.

9. The semiconductor memory device of claim 1, wherein the first memory cell array further comprises a plurality of first string select line contacts coupled to first string select lines of the first memory cell array,
wherein the second memory cell array further comprises a plurality of second string select line contacts coupled to second string select lines of the second memory cell array, and
wherein a first string select line contact of the plurality of first string select line contacts that is adjacent to a first cell region of the first memory cell array is not coupled to a second string select line contact of the plurality of second string select line contacts that is adjacent to a second cell region of the second memory cell array.

10. The semiconductor memory device of claim 9, wherein a first common source line of the first memory cell array is electrically coupled to a second common source line of the second memory cell array.

11. The semiconductor memory device of claim 10, wherein the first cell array structure further comprises a first bitline coupling the first memory cell array to the peripheral circuit structure,
wherein the second cell array structure further comprises a second bitline coupling the second memory cell array to the peripheral circuit structure, and
wherein the first bitline is coupled to the second bitline.

12. The semiconductor memory device of claim 1, wherein the first conductive plate structure comprises a first tapered shape in which a first width of the first conductive plate structure decreases as a third distance from the first memory cell array increases, and
wherein the second conductive plate structure comprises a second tapered shape in which a second width of the first conductive plate structure decreases as a fourth distance from the second memory cell array increases.

13. The semiconductor memory device of claim 12, wherein the first conductive plate structure comprises a first cell plate on a first cell region of the first memory cell array and a plurality of first partition plates on a first connection region of the first memory cell array, the first connection region being different from the first cell region, and
wherein the second conductive plate structure comprises a second cell plate on a second cell region of the second memory cell array and a plurality of second partition plates on a second connection region of the second memory cell array.

14. A semiconductor memory device comprising:
a peripheral circuit structure comprising a circuit board, a peripheral circuit on the circuit board, a first insulating layer partially covering the peripheral circuit, and a plurality of first bonding pads on the first insulating layer;
a first cell array structure comprising a first memory cell array, a first conductive plate structure on the first memory cell array, a second insulating layer partially covering the first memory cell array, a plurality of second bonding pads on the second insulating layer, and a plurality of third bonding pads on the second insulating layer; and
a second cell array structure stacked on the first cell array structure, and comprising a second memory cell array, a second conductive plate structure on the second memory cell array, a third insulating layer partially covering the second memory cell array, and a plurality of fourth bonding pads on the third insulating layer,
wherein the first cell array structure and the second cell array structure are sequentially stacked in a vertical direction on the peripheral circuit structure,
wherein the plurality of first bonding pads respectively contact the plurality of second bonding pads,
wherein the plurality of third bonding pads respectively contact the plurality of fourth bonding pads,
wherein the first memory cell array comprises a first stepped structure in which a first planar area of the first stepped structure gradually decreases as a first distance from the first conductive plate structure increases,
wherein the second memory cell array comprises a second stepped structure in which a second planar area of the second stepped structure gradually decreases as a second distance from the second conductive plate structure increases, wherein the first conductive plate structure comprises a first cell plate on a first cell region of the first memory cell array coupled to a first common source line, wherein the second conductive plate structure comprises a second cell plate on a second cell region of the second memory cell array coupled to a second common source line, wherein the first cell plate comprises a first tapered shape in which a first width of the first cell plate decreases as a third distance from the first memory cell array increases, and wherein the second cell plate comprises a second tapered shape in which a second width of the second cell plate decreases as a fourth distance from the second memory cell array increases.

15. The semiconductor memory device of claim 14, wherein the second cell array structure further comprises a plurality of fifth bonding pads on the second conductive plate structure, and a third cell array structure, wherein the third cell array structure comprises a third memory cell array, a third conductive plate structure on the third memory cell array, a fourth insulating layer partially covering the third memory cell array, and a plurality of sixth bonding pads on the fourth insulating layer, wherein the plurality of fifth bonding pads contact the plurality of sixth bonding pads, wherein the third memory cell array comprises a third stepped structure in which a third planar area of the third memory cell array gradually decreases as a fifth distance from the third conductive plate structure increases, wherein the first memory cell array further comprises a plurality of first wordlines, wherein the second memory cell array further comprises a plurality of second wordlines, wherein the third memory cell array further comprises a plurality of third wordlines, wherein the first cell array structure further comprises a first wordline contact coupled to a first wordline of the plurality of first wordlines of the first memory cell array, wherein the second cell array structure further comprises a second wordline contact coupled to a second wordline of the plurality of second wordlines of the second memory cell array, wherein the third cell array structure further comprises a third wordline contact coupled to a third wordline of the plurality of third wordlines of the third memory cell array, and wherein the first wordline contact, the second wordline contact, and the third wordline contact are electrically coupled to each other.

16. The semiconductor memory device of claim 14, wherein the first conductive plate structure is on the first cell region of the first memory cell array, wherein the second conductive plate structure is on the second cell region of the second memory cell array, wherein the first conductive plate structure is not disposed on a first connection region of the first memory cell array, the first connection region being different from the first cell region, and wherein the second conductive plate structure is not disposed on a second connection region of the second memory cell array, the second connection region being different from the second cell region.

17. The semiconductor memory device of claim 15, wherein the first cell array structure comprises a first via and a second via which couple the first wordline contact to the plurality of third bonding pads, wherein the second cell array structure comprises a third via and a fourth via which couple the second wordline contact to the plurality of fifth bonding pads, wherein the first via is disposed between the plurality of third bonding pads and the second via, and wherein the third via is disposed between the plurality of fifth bonding pads and the fourth via.

18. The semiconductor memory device of claim 17, wherein a third width of a first lower surface of the first via is greater than a fourth width of a first upper surface of the first wordline contact, and wherein a fifth width of a second lower surface of the third via is greater than a sixth width of a second upper surface of the second wordline contact.

19. A semiconductor memory device comprising:
a peripheral circuit structure comprising a circuit board, a peripheral circuit on the circuit board, a first insulating layer partially covering the peripheral circuit, and a plurality of bonding pads on the first insulating layer;
a first cell array structure comprising a first memory cell array, a first conductive plate structure on the first memory cell array, a second insulating layer partially covering the first memory cell array, a plurality of second bonding pads on the second insulating layer, and a plurality of third bonding pads on the second insulating layer;
a second cell array structure stacked on the first cell array structure, and comprising a second memory cell array, a second conductive plate structure on the second memory cell array, a third insulating layer partially covering the second memory cell array, and a plurality of fourth bonding pads on the third insulating layer,
wherein the first cell array structure and the second cell array structure are sequentially stacked in a vertical direction on the peripheral circuit structure,
wherein the plurality of first bonding pads respectively contact the plurality of second bonding pads,
wherein the plurality of third bonding pads respectively contact the plurality of fourth bonding pads,
wherein the first memory cell array comprises:
  a plurality of first cell strings;
  a plurality of first wordlines;
  a plurality of first ground select lines; and
  a first stepped structure in which a first planar area of the first memory cell array gradually decreases as a first distance from the first conductive plate structure increases,
wherein the second memory cell array comprises:
  a plurality of second cell strings;
  a plurality of second wordlines;
  a plurality of second ground select lines; and
  a second stepped structure in which a second planar area of the second memory cell array gradually decreases as a second distance from the second conductive plate structure increases,
wherein a first wordline of the plurality of first wordlines is coupled to a second wordline of the plurality of second wordlines,
wherein the plurality of first cell strings are coupled to a third wordline of the plurality of first wordlines,
wherein the plurality of second cell strings are coupled to a fourth wordline of the plurality of second wordlines, and wherein a first number of the plurality of first ground select lines coupled to the plurality of first cell strings is different from a second number of the plurality of second ground select lines coupled to the plurality of second cell strings.

20. The semiconductor memory device of claim 19, wherein a third number of the plurality of first cell strings is different from a fourth number of the plurality of second cell strings.

\* \* \* \* \*